United States Patent
Chai et al.

(10) Patent No.: US 12,495,674 B2
(45) Date of Patent: Dec. 9, 2025

(54) DISPLAY PANEL AND DISPLAY APPARATUS

(71) Applicants: WUHAN TIANMA MICROELECTRONICS CO., LTD., Wuhan (CN); Wuhan Tianma Microelectronics Co., Ltd. Shanghai Branch, Shanghai (CN)

(72) Inventors: Huiping Chai, Wuhan (CN); Jiamin Guo, Wuhan (CN); Lijing Han, Wuhan (CN)

(73) Assignees: Wuhan Tianma Microelectronics Co., Ltd., Wuhan (CN); Wuhan Tianma Microelectronics Co., Ltd. Shanghai Branch, Shanghai (CN)

( * ) Notice: Subject to any disclaimer, the term of this patent is extended or adjusted under 35 U.S.C. 154(b) by 703 days.

(21) Appl. No.: 17/824,423

(22) Filed: May 25, 2022

(65) Prior Publication Data

US 2022/0285654 A1   Sep. 8, 2022

(30) Foreign Application Priority Data

Dec. 29, 2021   (CN) .......................... 202111636895.4

(51) Int. Cl.
*H10K 59/121* (2023.01)
*H10K 59/65* (2023.01)
*H10K 59/80* (2023.01)

(52) U.S. Cl.
CPC ....... *H10K 59/121* (2023.02); *H10K 59/1213* (2023.02); *H10K 59/1216* (2023.02); *H10K 59/65* (2023.02); *H10K 59/80518* (2023.02)

(58) Field of Classification Search
CPC .. H10K 50/858; H10K 59/65; H10K 59/1213; H10K 59/1216
See application file for complete search history.

(56) References Cited

U.S. PATENT DOCUMENTS

| | | | |
|---|---|---|---|
| 9,142,802 B2* | 9/2015 | Miyamoto | H10K 59/879 |
| 2023/0200149 A1* | 6/2023 | Yoon | H10K 59/13 |
| | | | 257/72 |
| 2023/0209943 A1* | 6/2023 | Sugitani | H10K 59/1315 |
| | | | 257/40 |

FOREIGN PATENT DOCUMENTS

| | | |
|---|---|---|
| CN | 110309775 A | 10/2019 |
| CN | 111725429 A | 9/2020 |

* cited by examiner

*Primary Examiner* — Hung K Vu
(74) *Attorney, Agent, or Firm* — Christensen O'Connor Johnson Kindness PLLC

(57) ABSTRACT

Provided are a display panel and a display apparatus. A display region of the display panel includes a first display region and a second display region. The display panel includes a substrate, and microstructures and optical auxiliary structures that are located on one side of the substrate. The first display region is provided with at least one microstructure. The first display region includes a light-emitting device layer. The light-emitting device layer and the microstructure are located on the same side of the substrate. The light-emitting device layer includes a first electrode layer, a light-emitting layer, and a second electrode layer. The second electrode layer is located on a side of the first electrode layer that is away from the substrate, and the microstructure is located on a side of the second electrode layer that is close to the substrate.

19 Claims, 20 Drawing Sheets

US 12,495,674 B2

DISPLAY PANEL AND DISPLAY APPARATUS

CROSS REFERENCE TO RELATED APPLICATIONS

The present application claims priority to Chinese Patent Application No. CN 202111636895.4, filed on Dec. 29, 2021, the content of which is incorporated herein by reference in its entirety.

TECHNICAL FIELD

The present disclosure relates to the technical field of display, and in particular, to a display panel and a display apparatus.

BACKGROUND

In an electronic product, such as a mobile phone or a tablet computer, a front camera, an infrared sensing element, and other optical devices occupy particular space on the front of the product, affecting a screen-to-body ratio. With the emergence of the concept of full screen in the display field, major manufacturers are endeavoring to research in the full screen field. At present, it is commonly considered that an under-screen optical sensor solution is a favorable solution that can implement a true full screen. By setting an optical sensor, such as a camera, under a display region, the position of the camera can realize a display function normally, and when the camera needs to be used, light penetrates the display panel to reach the camera and is finally used by the camera. When in use, the current under-screen optical sensor solution has a low light transmission rate, affecting the performance of the optical sensor.

SUMMARY

Embodiments of the present disclosure provide a display panel and a display apparatus, to solve the problem of low transmittance of a display panel in the prior art.

According to a first aspect, the embodiments of the present disclosure provide a display panel, including a display region, wherein the display region includes a first display region and a second display region. The display panel includes a substrate, and microstructures and optical auxiliary structures that are located on one side of the substrate. A refractive index of the microstructures may be less than a refractive index of the optical auxiliary structures, and each microstructure may be located on a side of the corresponding optical auxiliary structure that is away from the substrate. The microstructure may be embedded in the side of the corresponding optical auxiliary structure that is away from the substrate. The first display region is provided with at least one microstructure. The first display region includes a light-emitting device layer. The light-emitting device layer and the microstructure are located on the same side of the substrate. The light-emitting device layer includes a first electrode layer, a light-emitting layer, and a second electrode layer, and the second electrode layer is located on a side of the first electrode layer that is away from the substrate. The microstructure is located on a side of the second electrode layer that is close to the substrate.

According to a second aspect, the embodiments of the present disclosure provide a display apparatus, including an optical sensor and the display panel described in any embodiment of the present disclosure, wherein in a direction perpendicular to a plane in which the substrate is located, the optical sensor overlaps with at least part of the first display region.

BRIEF DESCRIPTION OF THE DRAWINGS

To describe the technical solutions in the embodiments of the present disclosure or in the prior art more clearly, the following briefly describes the accompanying drawings for describing the embodiments or the prior art. The accompanying drawings in the following description show representative embodiments of the present disclosure, and a person skilled in the art may still derive other drawings from these accompanying drawings.

DETAILED DESCRIPTION

In order to make the objectives, technical solutions and advantages of the embodiments of the present disclosure more clear, the technical solutions in the embodiments of the present disclosure will be clearly and completely described below in conjunction with the accompanying drawings in the embodiments of the present disclosure. Obviously, the described embodiments are some, rather than all of the embodiments of the present disclosure. All other embodiments obtained by persons of ordinary skill in the art based on the embodiments of the present disclosure shall fall within the protection scope of the present disclosure.

Terms used in the embodiments of the present disclosure are for the purpose of describing specific embodiments, and are not intended to limit the present disclosure. Unless otherwise specified in the context, words, such as "a", "the", and "this", in a singular form in the embodiments of the present disclosure and the appended claims include plural forms.

In the prior art, the following design method is usually used to improve display panel transmittance, for example: reducing a line width of metal lines from the perspective of pixel design, to reduce the area of a non-transmissive region; or improving the transmittance of an organic and/or inorganic layer in the panel from the process considerations. However, affected by the process conditions, panel resolution and other factors, the above designs improve the display panel transmittance by a limited degree.

Figure 1:
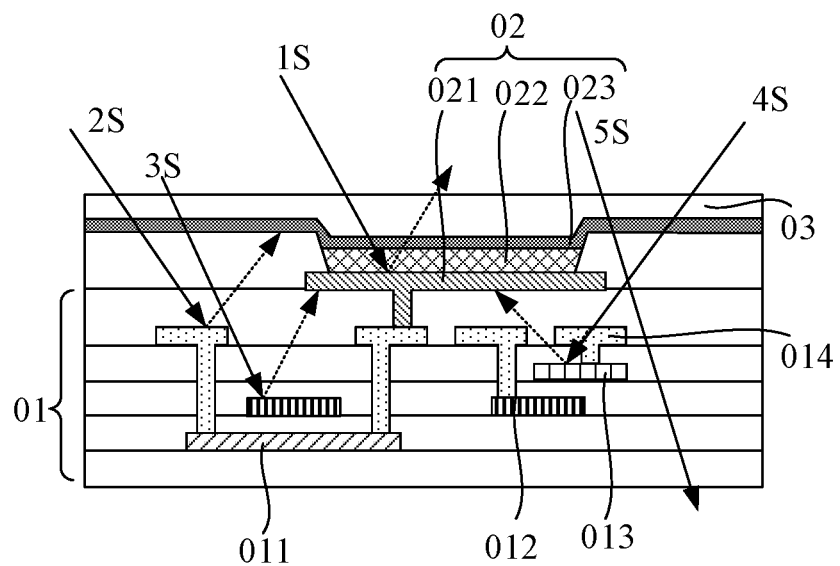
FIG. 1 is a schematic diagram of an optical path of light incident on a display panel in the prior art.

FIG. 1 is a schematic diagram of an optical path of light incident on a display panel in the prior art. As shown in FIG. 1, the display panel includes a driving layer 01 and a light-emitting device 02 on a side of the driving layer 01. The driving layer 01 includes a semiconductor layer 011, a first metal layer 012, a second metal layer 013, and a third metal layer 014. The light-emitting device 02 includes a first electrode 021, a light-emitting layer 022, and a second electrode 023. The light-emitting device 02 is further provided with an encapsulation structure 03 on a side away from the driving layer 01. External light enters into the display panel from a side of the encapsulation structure 03. When the first electrode 021 is a reflecting electrode, light 1S transmitted to the first electrode 021 will be reflected by the first electrode 021 and then exit the display panel; light 2S transmitted to the third metal layer 014 is reflected by the third metal layer 014 and then exits the display panel; light 3S transmitted to the first metal layer 012 is reflected by the first metal layer 012 and then exits the display panel; light 4S transmitted to the second metal layer 013 is reflected by the second metal layer 013 and then exits the display panel. Part of light, such as light 5S, will directly penetrate the display panel and be emitted from the back side of the display panel, to be received by an optical sensor (not shown). However, in fact, after light enters the display panel, most of the light will be reflected and refracted inside the display panel like light 1S, light 2S, light 3S, and light 4S, but cannot be emitted from the back side of the display panel, which severely affects the light transmittance. In addition, when the under-screen optical sensor solution is used, part of large-angle light penetrating the display panel cannot be received and used by the optical sensor either.

To improve the transmittance of the display panel, the embodiments of the present disclosure provide a display panel. Microstructures and optical auxiliary structures cooperating with the microstructures are added in the structure of the display panel, so as to use light entering the display panel, so that the light can be emitted from the back side of the display panel, thereby improving the transmittance of the display panel.

Figure 2:
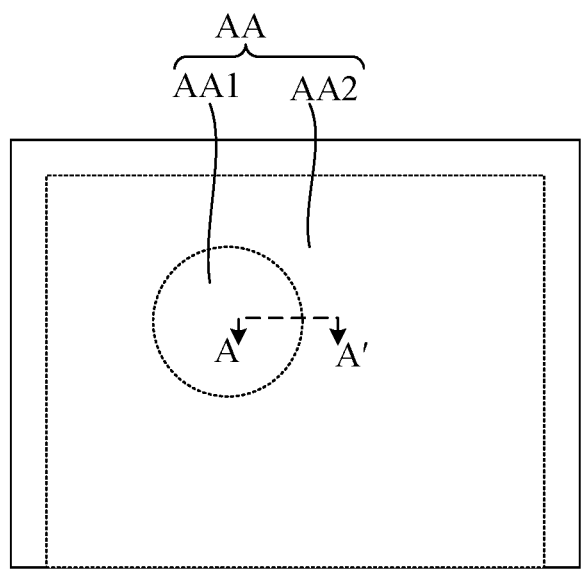
FIG. 2 is a schematic diagram of a display panel according to an embodiment of the present disclosure.
Figure 3:
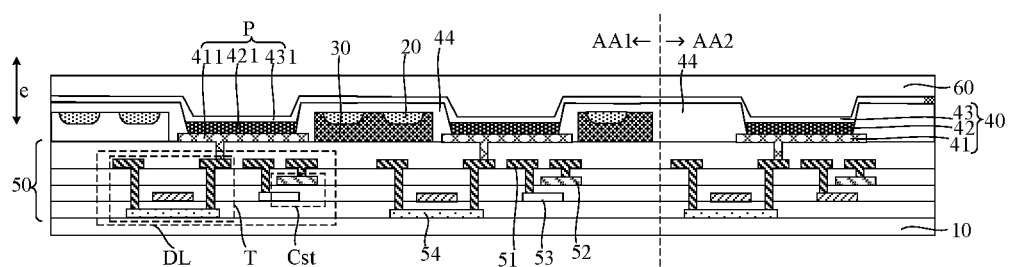
FIG. 3 is a schematic cross-sectional view along a line A-A' in FIG. 1.

FIG. 2 is a schematic diagram of a display panel according to an embodiment of the present disclosure. FIG. 3 is a schematic cross-sectional view along a line A-A' in FIG. 1. As shown in FIG. 2, the display panel includes a display region AA, and the display region AA includes a first display region AA1 and a second display region AA2. The first display region AA1 and the second display region AA2 each include a plurality of light-emitting devices. Moreover, light transmittance of the first display region AA1 may be greater than light transmittance of the second display region AA2. In some implementations, the density of the light-emitting devices disposed in the first display region AA1 is less than the density of the light-emitting devices disposed in the second display region AA2, or the density of the pixel circuits disposed in the first display region AA1 is less than the density of the pixel circuits disposed in the second display region AA2, or the densities of the light-emitting devices and the pixel circuits disposed in the first display region AA1 are both less than the densities of the light-emitting devices and the pixel circuits disposed in the second display region AA2. In other implementations, for light-emitting devices of the same color, the size of the light-emitting device in the first display region AA1 (which means the area of the light-emitting device) is less than the size of the light-emitting device in the second display region AA2. In other embodiments, the size of the pixel circuit in the first display region AA1 is less than the size of the pixel circuit in the second display region AA2, wherein the size of the pixel circuit may be calculated according to a total area occupied by transistors in the pixel circuit. Optionally, sizes of at least some transistors in the pixel circuit in the first display region AA1 are set to be less than sizes of transistors of the same types in the pixel circuit in the second display region AA2, wherein transistors of a same type refer to transistors with a same function in the pixel circuit. In other implementations, pixel circuits of at least some light-emitting devices for driving the first display region AA1 may be set on the periphery of the first display region AA1, for example, located in the second display region AA2.

As shown in FIG. 3, the display panel includes a substrate 10, and microstructures 20 and optical auxiliary structures 30 that are located on one side of the substrate 10. A refractive index of the microstructures 20 is less than a refractive index of the optical auxiliary structures 30. Each microstructure 20 is located on a side of the corresponding optical auxiliary structure 30 that is away from the substrate 10, and the microstructure 20 is embedded in the side of the corresponding optical auxiliary structure 30 that is away from the substrate 10. That is, at least part of each microstructure 20 is wrapped by the corresponding optical auxiliary structure 30. In other words, the optical auxiliary structure 30 is provided with a groove on a side away from the substrate 10, and the microstructure 20 fills the groove.

The display panel includes a light-emitting device layer 40 and a pixel circuit layer 50. The light-emitting device layer 40 includes a first electrode layer 41, a light-emitting layer 42, and a second electrode layer 43. The second electrode layer 43 is located on a side of the first electrode layer 41 that is away from the substrate 10. The light-emitting device layer 40 includes a plurality of light-emitting devices P. The display panel further includes a pixel defining layer 44, which is used for separating adjacent light-emitting devices P.

Each light-emitting device P includes a first electrode 411, a second electrode 431, and a light-emitting function layer 421 located between the two electrodes, wherein the first electrode 411 is located in the first electrode layer 41, the second electrode 431 is located in the second electrode layer 43, and the light-emitting function layer 421 is located in the light-emitting layer 42. The pixel circuit layer 50 is located between the substrate 10 and the light-emitting device layer 40.

In some embodiments, the first electrode 411 includes a reflective layer and a metal oxide layer that are stacked, wherein the reflective layer is located on a side of the metal oxide layer that is close to the substrate 10. In some embodiments, a material of the reflective layer includes one or more materials selected from a group consisting of Ag, Mg, Al, Pt, Pd, Au, Ni, Nd, Ir, and Cr. In some embodiments, the metal oxide layer includes one or more selected from a group consisting of ITO, IZO, ZnO, or $In_2O_3$. The first electrode 411 is a reflecting electrode. The second electrode 431 is a semi-reflective semi-transmissive electrode. The second electrode 431 includes a small-work-function compound having, in some embodiments, Li, Ca, LiF/Ca, LiF/Al, Al, Mg or a combination thereof, and transparent materials such as ITO, IZO, ZnO or $In_2O_3$ may be deposited on the compound. In the light-emitting device P, light transmitted from the light-emitting function layer 421 to the second electrode 431 is directly emitted from the second electrode 431, and light transmitted from the light-emitting function layer 421 to the first electrode 411 is reflected by the first electrode 411 and then emitted through the second electrode 431. The first electrode 411 is a reflecting electrode, which can improve the light-emitting efficiency of the light-emitting device P.

The pixel circuit layer 50 includes a first metal layer 51, a second metal layer 52, a third metal layer 53, and a semiconductor layer 54. In a direction e perpendicular to a plane in which the substrate 10 is located, distances from the first metal layer 51, the second metal layer 52, the third metal layer 53, and the semiconductor layer 54 to the substrate 10 decrease gradually. In other words, in the direction e perpendicular to the plane in which the substrate 10 is located, the first metal layer 51 is a metal layer closest to the light-emitting device layer 40. In the direction perpendicular to the plane in which the substrate 10 is located, insulation layers are arranged between adjacent metal layer, and between the metal layer and the semiconductor layer. Using the first metal layer 51 as an example, in some embodiments, a metal structure in the first metal layer 51 is connected to the metal layers between the first metal layer 51 and the substrate 10 or to the semiconductor layer 54 through a via hole penetrating the insulation layers, and the via hole in the insulation layers is filled with a material the same as that of the first metal layer 51. In the embodiments of the present disclosure, during calculation of the distance from each metal layer to the substrate 10, the position of the metal layer is not defined by the metal material filled in the via hole of the insulation layer, but by the metal layer that is on a side of an insulation layer away from the substrate 10 and that is in contact with the insulation layer.

The pixel circuit layer 50 includes a plurality of pixel circuits DL, and the pixel circuits DL are used for driving the light-emitting devices to emit light. Each pixel circuit DL includes a storage capacitor Cst and a plurality of thin film transistors T. As shown in FIG. 3, an encapsulation layer 60 is further disposed on a side of the light-emitting device layer 40 that is away from the pixel circuit layer 50. In some implementations, the encapsulation layer 60 includes encapsulation glass; in other implementations, the encapsulation layer 60 includes at least one inorganic layer and at least one organic layer, for example, a three-layer structure including an inorganic layer, an organic layer, and an inorganic layer in sequence.

It may be understood that, signal lines of the display panel may be prepared by using the metal layers in the pixel circuit layer 50, for example, a scanning line, a data line, a light-emitting control line, a reset signal line, and a power signal line. In some embodiments, the scanning line is located in the third metal layer 53. The light-emitting control line and the reset signal line are located in the second metal layer 52, and the data line and the power signal line are located in the first metal layer 51.

In some embodiments, a manufacturing material of the first metal layer 51 includes titanium and aluminum. In an embodiment, the first metal layer 51 is a titanium/aluminum/titanium three-layer structure.

In some embodiments, manufacturing materials of the second metal layer 52 and the third metal layer 53 include molybdenum.

In some embodiments, a manufacturing material of the semiconductor layer 54 includes silicon. In other embodiments, a manufacturing material of the semiconductor layer 54 includes a metal oxide.

Figure 4:
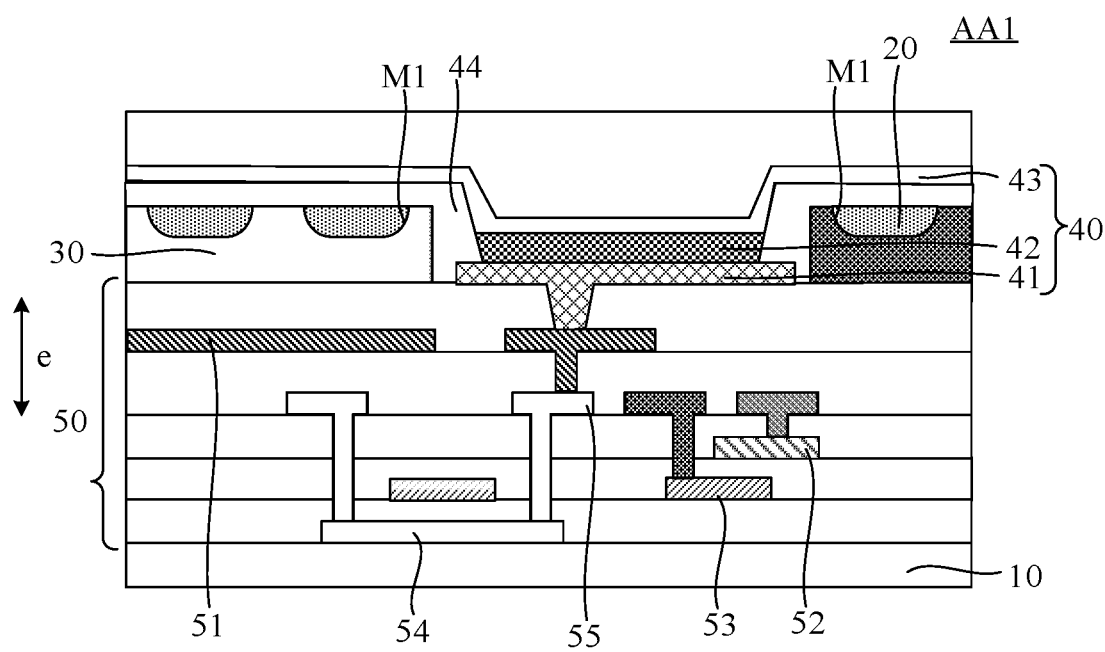
FIG. 4 is a schematic cross-sectional view of another display panel according to an embodiment of the present disclosure.

In some embodiments, FIG. 4 is a schematic cross-sectional view of another display panel according to an embodiment of the present disclosure. As shown in FIG. 4, the pixel circuit layer 50 includes a first metal layer 51, a second metal layer 52, a third metal layer 53, a semiconductor layer 54, and a fourth metal layer 55, wherein distances from the first metal layer 51, the fourth metal layer 55, the second metal layer 52, the third metal layer 53, and the semiconductor layer 54 to the substrate 10 decrease gradually. That is, the fourth metal layer 55 is located between the first metal layer 51 and the second metal layer 52, and the first metal layer 51 is located on a side of the fourth metal layer 55 that is away from the substrate 10. Optionally, the fourth metal layer 55 and the first metal layer 51 are made of the same manufacturing material. In this implementation, signal lines such as a scanning line, a data line, a light-emitting control line, a reset signal line, and a power signal line are disposed in the four metal layers.

In some embodiments, one of the data line and the power signal line is located in the first metal layer 51, and the other is located in the fourth metal layer 55. Such a configuration can reduce the coupling between the data line and the power signal line and improve a display effect.

In other embodiments, the power signal line adopts a double-layer wiring design. The power signal line includes a first wiring portion located in the first metal layer 51 and a second wiring portion located in the fourth metal layer 55, wherein the first wiring portion and the second wiring portion are connected in parallel. Such a configuration can reduce a voltage drop on the power signal line, thereby reducing power consumption and improving the display effect.

In the embodiments of the present disclosure, at least one microstructure 20 is disposed in the first display region AA1. In the first display region AA1, the light-emitting device layer 40 and the microstructure 20 are located on the same side of the substrate 10, and the microstructure 20 is located on a side of the second electrode layer 43 that is close to the substrate 10.

Figure 5:
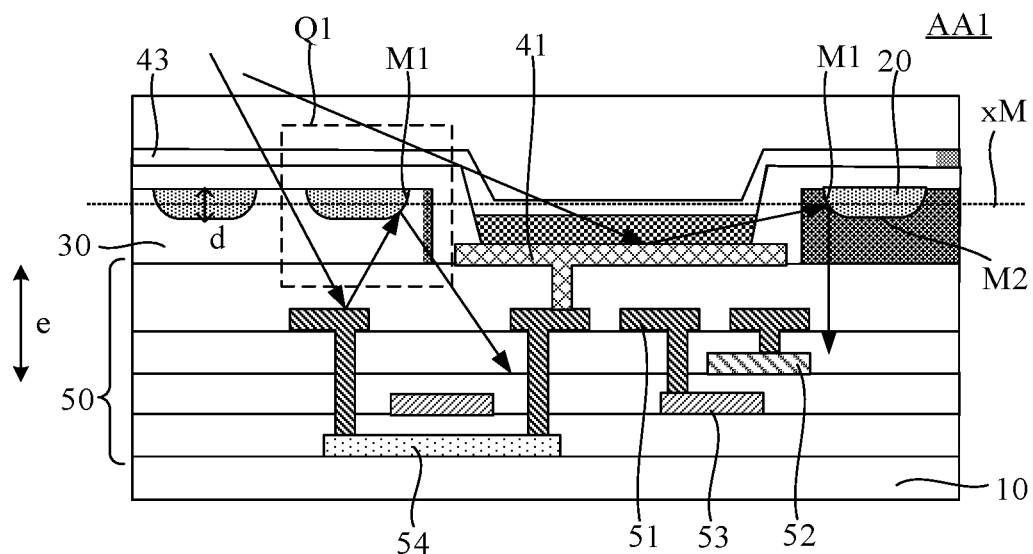
FIG. 5 is a partial schematic cross-sectional view of a first display region in a display panel according to an embodiment of the present disclosure.

FIG. 5 is a partial schematic cross-sectional view of a first display region in a display panel according to an embodiment of the present disclosure. As shown in FIG. 5, the microstructure 20 is located on a side of the second electrode layer 43 that is close to the substrate 10. The microstructure 20 is embedded in a side of the optical auxiliary structure 30 that is away from the substrate 10. In this case, a contact interface between the microstructure 20 and the optical auxiliary structure 30 includes a side surface and a bottom surface. FIG. 5 shows a virtual surface xM parallel to the plane in which the substrate 10 is located, wherein the plane in which the substrate 10 is located may be interpreted as follows: the substrate 10 is considered as a plane without thickness and the plane is located at the position of the substrate 10. It should be noted that, the side surface where the microstructure 20 and the optical auxiliary structure 30 are in contact with each other is a first interface M1, and a contact interface between the side of the microstructure 20 close to the substrate 10 and the optical auxiliary structure 30 is a bottom surface M2. It can be seen from FIG. 5 that, the first interface M1 for contact between the microstructure 20 and the optical auxiliary structure 30 intersects the virtual surface xM, that is, the first interface M1 intersects a surface parallel to the plane in which the substrate 10 is located.

The display panel includes a display surface and a back side away from the display surface. The display surface is a side on which the display panel displays a picture. After light enters the display panel from the display surface, the metal layers in the pixel circuit layer 50 and the first electrode layer 41 in the light-emitting device layer 40 can all reflect the light, affecting the light transmittance of the first display region AA1. After the microstructures 20 and the optical auxiliary structures 30 cooperating with the microstructures 20 are disposed in the display panel, part of light will be incident on the side surface for contact between the microstructure 20 and the optical auxiliary structure 30, and this part of light may be large-angle light that is incident on the display panel, or light in the display panel after being reflected by the metal structure. A refractive index of the microstructure 20 is less than a refractive index of the optical auxiliary structure 30. In this case, when transmitted from the optical auxiliary structure 30 to the microstructure 20, light is transmitted from an optically denser medium to an optically thinner medium. An optical path is changed by using a reflection (part of the light may be totally reflected) or refraction effect on the contact interface when the light is transmitted from the optically denser medium to the optically thinner medium, so that the light can be emitted from the back side of the display panel, thereby improving the light transmittance of the first display region AA1. Moreover, other functional layers such as an encapsulation layer may further be disposed on a side of the second electrode layer 43 that is away from the substrate 10. The microstructures 20 are disposed on a side of the second electrode layer 43 that is close to the substrate 10, which will not affect the setting of functional layers on a side of the second electrode layer 43 that is away from the substrate 10, and can also reduce a distance from the light, of which the optical path is changed due to the reflection or refraction on the first interface M1, to the back side of the display panel, thereby reducing optical loss and further improving the light transmittance of the first display region AA1.

As shown in FIG. 5, in the direction e perpendicular to the plane in which the substrate 10 is located, a thickness of the microstructure 20 is d, wherein 20 µm≤d≤50 µm. A larger thickness d of the microstructure 20 indicates a larger area of the first interface M1 for contact between the microstructure 20 and the optical auxiliary structure 30. In this case, more light in the display panel can be transmitted to the first interface M1 for contact between the microstructure 20 and the optical auxiliary structure 30, so that more light can be emitted from the back side of the display panel after the optical path is changed. Meanwhile, only a limited amount of light in the display panel can be transmitted to the first interface M1, wherein light can be incident on the first interface M1 only when the light is at a certain angle with a direction parallel to the plane in which the substrate 10 is located. If the thickness d of the microstructure 20 is set to be excessively large, it hardly helps improve the light transmittance of the first display region AA1, and increases the overall thickness of the display panel. In the present disclosure, it is set that 20 µm≤d≤50 m after factors such as the process accuracy and yield of the microstructure 20 as well as the impact on the overall thickness of the display panel are taken into consideration, to ensure that the first interface M1 for contact between the microstructure 20 and the optical auxiliary structure 30 has a large enough area, which can effectively change the optical path of part of light in the display panel, thereby improving the light transmittance of the first display region AA1 and also causing less impact on the thickness of the display panel.

FIG. 5 schematically shows that the first interface M1 for contact between the microstructure 20 and the optical auxiliary structure 30 is a curved surface. The first interface M1 has a certain curvature. When the thickness of the microstructure 20 is fixed, the shape of the curved surface can increase the area of the first interface M1, so that more light can be transmitted to the first interface M1, which helps improve the light transmittance of the first display region AA1.

Figure 6:
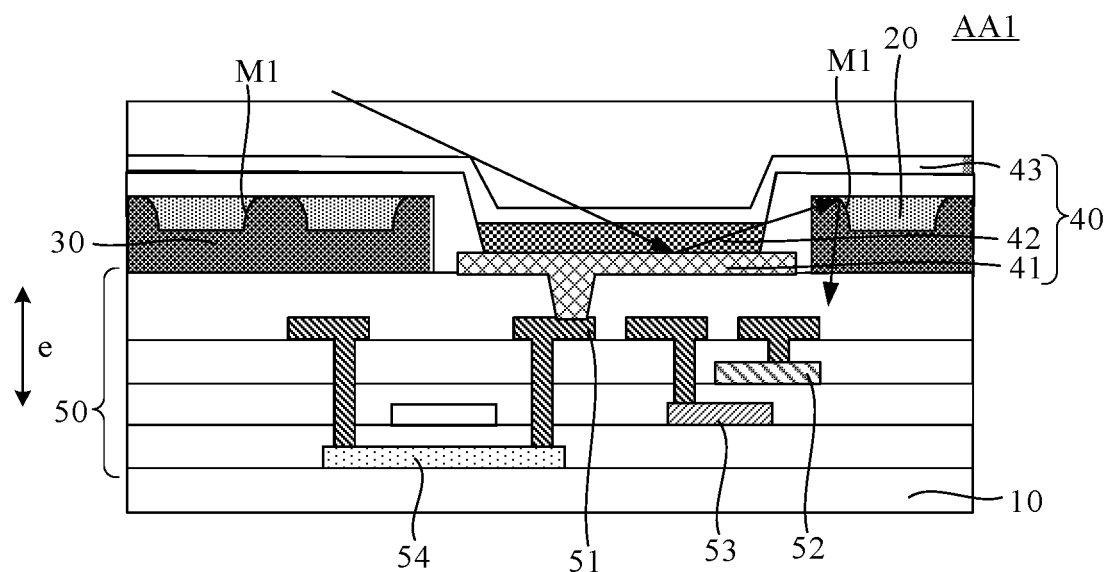
FIG. 6 is a schematic cross-sectional view of another display panel according to an embodiment of the present disclosure.
Figure 7:
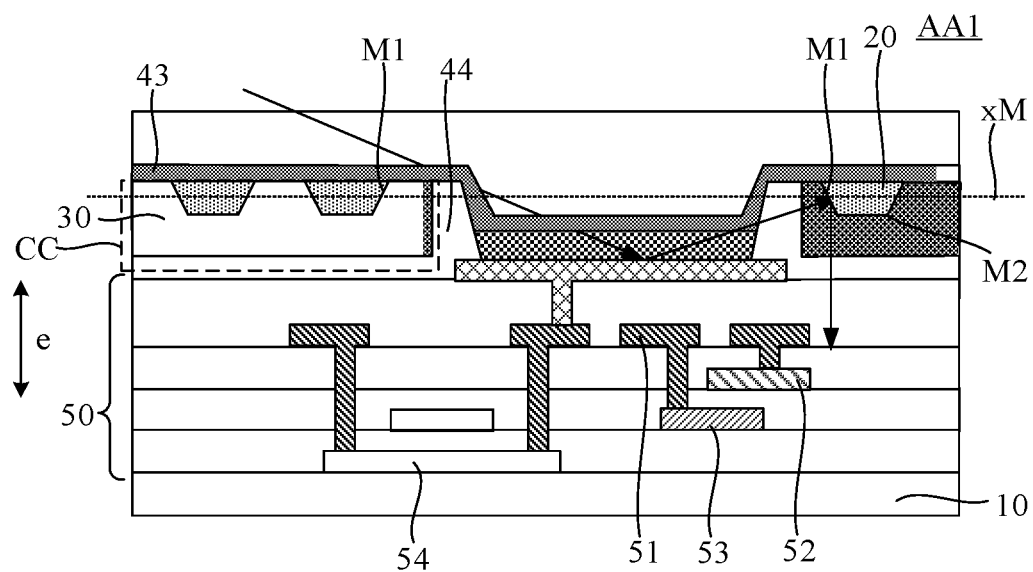
FIG. 7 is a schematic cross-sectional view of a first display region in another display panel according to an embodiment of the present disclosure.

FIG. 5 schematically shows that the first interface M1 protrudes towards the optical auxiliary structure 30 relative to the microstructure 20. In another embodiment, FIG. 6 is a schematic cross-sectional view of another display panel according to an embodiment of the present disclosure. As shown in FIG. 6, the first interface M1 is a curved surface, and the first interface M1 protrudes towards the interior of the microstructure 20. FIG. 6 schematically shows that light transmitted to the first interface M1 is reflected by the first interface M1 and then emitted from the back side of the display panel. Moreover, the first interface M1 has a certain curvature. When the thickness of the microstructure 20 is fixed, the shape of the curved surface can increase the area of the first interface M1, so that more light can be transmitted to the first interface M1, which helps improve the light transmittance of the first display region AA1. In other embodiments, FIG. 7 is a schematic cross-sectional view of a first display region in another display panel according to an embodiment of the present disclosure. It can be seen from the cross-sectional view in FIG. 7 that, the first interface M1 for contact between the microstructure 20 and the optical auxiliary structure 30 is substantially a plane. The first interface M1 intersects the virtual surface xM, and the virtual surface xM is parallel to the plane in which the substrate 10 is located. In practice, the shape of the first interface M1 for contact between the microstructure 20 and the optical auxiliary structure 30 may be designed according to process conditions and specific design requirements.

Figure 8:
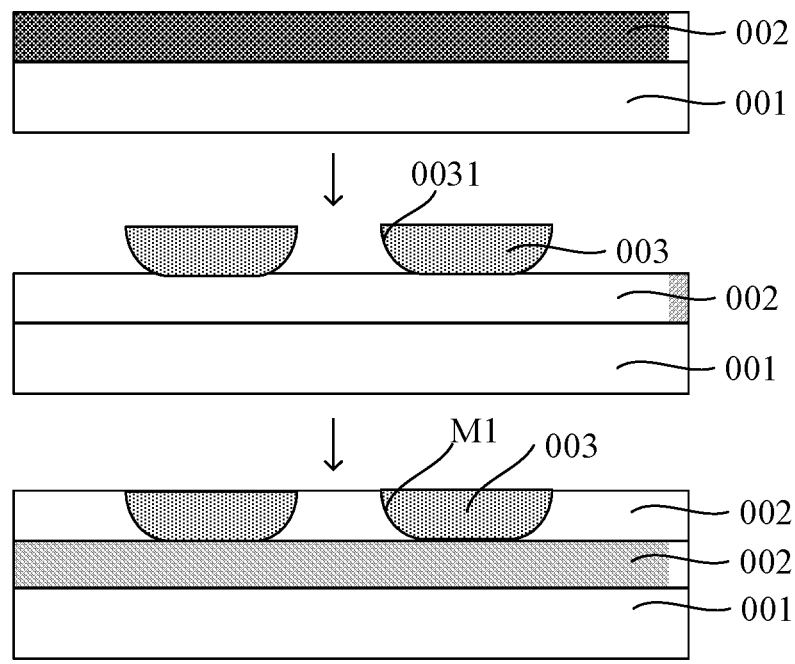
FIG. 8 is a schematic flowchart of a method for manufacturing a display panel according to an embodiment of the present disclosure.

In an embodiment, FIG. 8 is a schematic flowchart of a method for manufacturing a display panel according to an embodiment of the present disclosure. FIG. 8 schematically shows a method for manufacturing the microstructure 20 and the optical auxiliary structure in the display panel. As shown in FIG. 8, a layer of high-refractive-index material 002 is first manufactured on a base 001. The high-refractive-index material 002 is an organic material, and may be manufactured by using an ink-jet printing process, to facilitate leveling of the surface of the high-refractive-index material 002. Then, a low-refractive-index material 003 is manufactured on the high-refractive-index material 002. The shape of a sidewall 0031 of the low-refractive-index material 003 can be controlled by adjusting the manufacturing process. Next, a layer of high-refractive-index material 002 is further manufactured, and is made to be in contact with the sidewall 0031 of the low-refractive-index material 003. The low-refractive-index material 003 is the microstructure 20, the high-refractive-index material 002 is the optical auxiliary structure 30, and the sidewall 0031 is the first interface M1 for contact between the microstructure 20 and the optical auxiliary structure 30.

Figure 9:
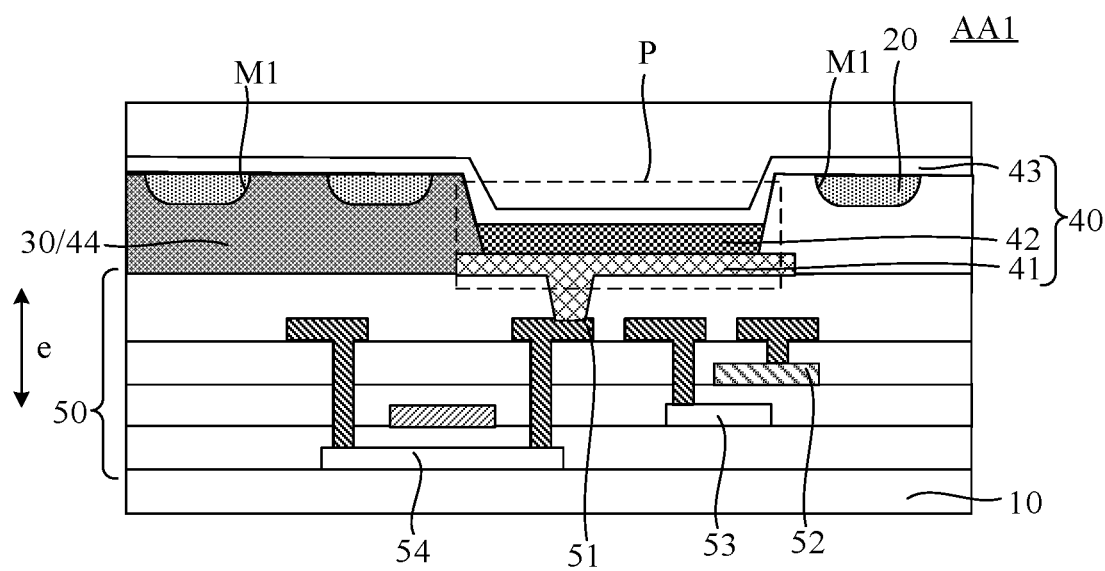
FIG. 9 is a schematic cross-sectional view of another display panel according to an embodiment of the present disclosure.

In some embodiments, FIG. 9 is a schematic cross-sectional view of another display panel according to an embodiment of the present disclosure. As shown in FIG. 9, the light-emitting device layer 40 further includes a pixel defining layer 44, and the pixel defining layer 44 is reused as an optical auxiliary layer 30. The microstructure 20 is embedded in a side of the pixel defining layer 44 that is away from the substrate 10. The pixel defining layer 44 is made of an organic material. The pixel defining layer 44 can be used for separating adjacent light-emitting devices P. Meanwhile, the cooperation with the pixel defining layer 44 and the microstructure 20 can act on light transmitted to the first interface M1, so that the light is emitted from the back side of the display panel, thereby improving the light transmittance of the first display region AA1. The pixel defining layer 44 is used as the optical auxiliary layer 30, so that it is unnecessary to manufacture an additional optical auxiliary layer 30 in the display panel, thereby simplifying the process and helping to reduce the thickness of the display panel.

In some embodiments, as shown in FIG. 4, the pixel defining layer 44 covers a side of the microstructure 20 that is away from the substrate 10. During manufacturing of the display panel, the optical auxiliary structure 30 and the microstructure 20 embedded in one side of the optical auxiliary structure 30 are manufactured. Then, the pixel defining layer 44 is manufactured, wherein the pixel defining layer 44 covers the microstructure 20 and part of the optical auxiliary structure 30.

In other embodiments, as shown in FIG. 7, the microstructure 20 and the optical auxiliary structure 30 that cooperate with each other are located in a groove CC of the pixel defining layer 44, and the second electrode layer 43 covers a side of the microstructure 20 that is away from the substrate 10. During manufacturing of the display panel, the first electrode layer 41 is manufactured first, and then the pixel defining layer 44 is manufactured, wherein the pixel defining layer 44 has a groove CC for carrying the optical auxiliary structure 30 and the microstructure 20. Next, the optical auxiliary structure 30 and the microstructure 20 that cooperate with each other are manufactured in the groove CC, wherein the microstructure 20 is embedded in a side of the optical auxiliary structure 30 that is away from the substrate 10. Then, the light-emitting layer 42 and the second electrode layer 43 in the display device layer 40 are manufactured.

In some implementations, the microstructure 20 has a first surface on a side away from the substrate 10, and a maximum angle that is formed between the first surface and the first interface M1 and faces towards the interior of the microstructure 20 is an acute angle.

Figure 10:
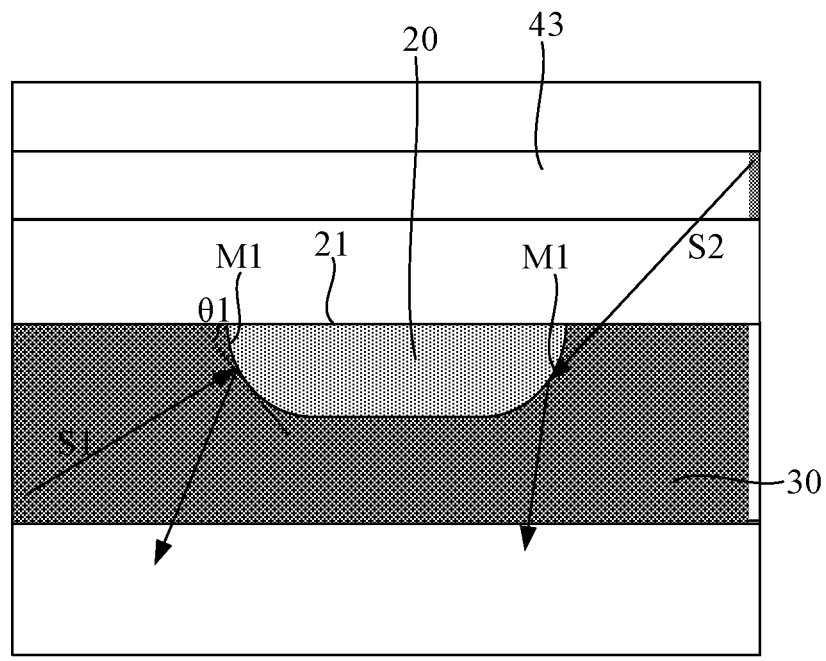
FIG. 10 is an enlarged schematic view of a region Q1 in FIG. 5.

FIG. 10 is an enlarged schematic view of a region Q1 in FIG. 5. FIG. 10 schematically shows that the first interface M1 for contact between the microstructure 20 and the optical auxiliary structure 30 is a curved surface. In the microstructure 20, the maximum angle that is formed between the first interface M1 and the first surface 21 and faces towards the interior of the microstructure 20 is θ1. When the first interface M1 is a curved surface, for a point on the curved surface, an angle θ1 that is formed between a tangent line of the point and the first surface 21 and faces towards an interior of the microstructure 20 is an angle between the first interface M1 and the first surface 21 at the position of the point, wherein $0°<θ1≤33°$. With such a configuration, the first interface M1 can reflect light S1 transmitted from a side of the microstructure 20 close to the substrate 10 to the first interface M1 (that is, light reflected by the metal structure inside the panel), and the reflected light propagates towards the substrate of the substrate 10, thereby improving the light transmittance of the first display region AA1. The first interface M1 can also reflect large-angle light S2 entering the display panel, to reduce an angle between the light and the direction perpendicular to the plane in which the substrate 10 is located, thereby improving the collimation of the light. Moreover, part of the large-angle light S2 may be totally reflected on the first interface M1. When an angle between the first interface M1 and the first surface 21 is reduced, more large-angle light can be totally reflected. The large-angle light generally refers to light that forms an acute angle greater than 45° with the direction perpendicular to the plane in which the substrate 10 is located. In some embodiments, when the microstructure 20 is disposed near the edge of the first display region AA1, the first interface M1 is used to reflect large-angle light, so that more light can be emitted from the position corresponding to the first display region AA1, to be received by the optical sensor, thereby improving the amount of light received by the optical sensor and improving the optical performance of the optical sensor.

In other embodiments, the maximum angle that is formed between the first surface of the microstructure 20 and the first interface M1 and faces towards the interior of the microstructure 20 is an obtuse angle.

Figure 11:
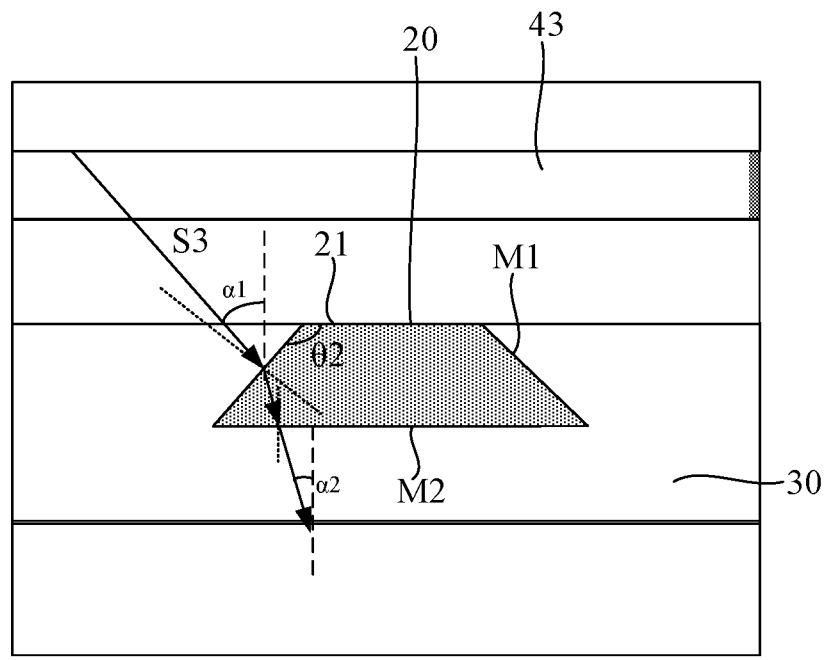
FIG. 11 is a partial schematic view of a first display region in another display panel according to an embodiment of the present disclosure.

FIG. 11 is a partial schematic view of a first display region of another display panel according to an embodiment of the present disclosure. As shown in FIG. 11, the microstructure 20 has a first surface 21 on a side away from the substrate 10. In the microstructure 20, a maximum angle that is formed between the first interface and the first surface and faces towards the interior of the microstructure 20 is θ2, wherein 123°≤θ2<180°. FIG. 11 schematically shows that the first interface M1 is substantially a plane. In some embodiments, the first interface M1 is a curved surface. FIG. 11 schematically shows large-angle light S3 entering the display panel, wherein the light S3 is transmitted to the microstructure 20 from the optical auxiliary structure 30 through the first interface M1, and is transmitted from an optically denser medium to an optically thinner medium. In this case, a refraction angle is larger than an incident angle. Then, the light passes through the bottom surface M2 for contact between the microstructure 20 and the optical auxiliary structure 30, and is transmitted to the substrate 10. In this implementation, the first interface M1 can reduce an angle between the light and the direction perpendicular to the plane in which the substrate 10 is located. As shown in FIG. 11, when light S3 is transmitted to the bottom surface M2, the angle between the light and the direction perpendicular to the plane in which the substrate 10 is located is α1; when the light S3 is finally emitted from the bottom surface M2 after the action of the first interface M1, an angle between the emergent light and the direction perpendicular to the plane in which the substrate 10 is located is α2. It can be seen that α2 is less than α1. In some embodiments, when the microstructure 20 is disposed near the edge of the first display region AA1, the first interface M1 is used to refract large-angle light, so that more light can be emitted from the position corresponding to the first display region AA1, to be received by the optical sensor, thereby improving the amount of light received by the optical sensor and improving the optical performance of the optical sensor.

In some implementations, as shown in FIG. 5, at least two microstructures 20 are embedded in one optical auxiliary structure 30. The microstructures 20 and the optical auxiliary structure 30 can be manufactured by using the manufacturing method in the embodiment shown in FIG. 8. During the manufacturing, it is unnecessary to perform patterning on the optical auxiliary structure 30, so as to simplify the manufacturing process.

Figure 12:
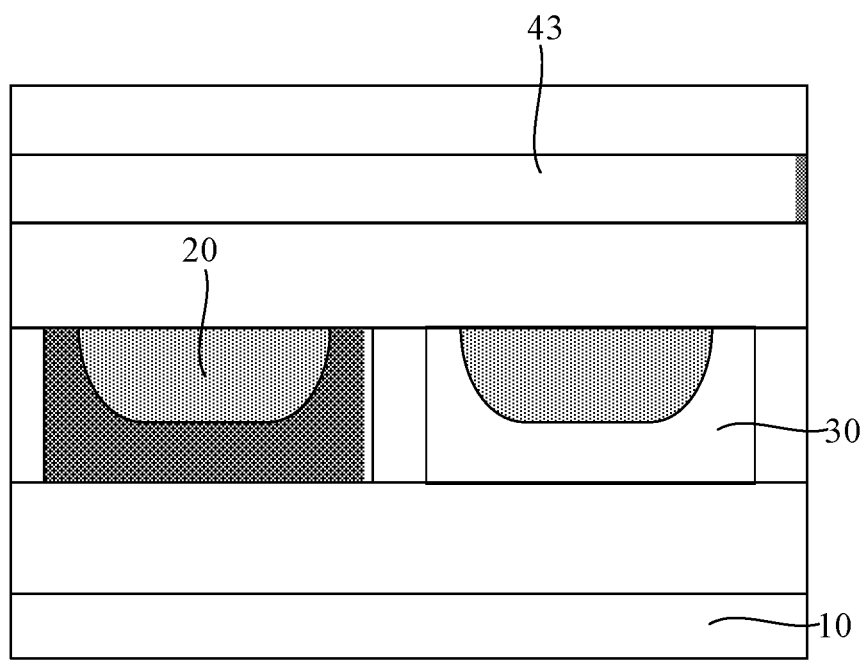
FIG. 12 is a simplified partial schematic view of a first display region in another display panel according to an embodiment of the present disclosure.

In other embodiments, FIG. 12 is a simplified partial schematic view of a first display region in another display panel according to an embodiment of the present disclosure. As shown in FIG. 12, for two adjacent microstructures 20, the optical auxiliary structures 30 respectively corresponding to the two microstructures 20 are independent of each other. The two adjacent microstructures 20 refer to two microstructures 20 adjacent to each other in the same horizontal direction without any other microstructure 20 in between, wherein an interval between the two microstructures 20 is not limited. In this implementation, the optical auxiliary structures 30 respectively corresponding to the two adjacent microstructures 20 are not connected to each other. That is, the optical auxiliary structures 30 corresponding to the microstructures 20 are patterned structures. In the embodiments of the present disclosure, the microstructures 20 and the optical auxiliary structures 30 are added to the structure layers of the display panel, and the optical auxiliary structures 30 may be patterned according to layer positions of the microstructures 20 and the optical auxiliary structures 30, which helps improve the flatness of the base after manufacturing of the microstructures 20 and the optical auxiliary structures 30 is finished.

Figure 13:
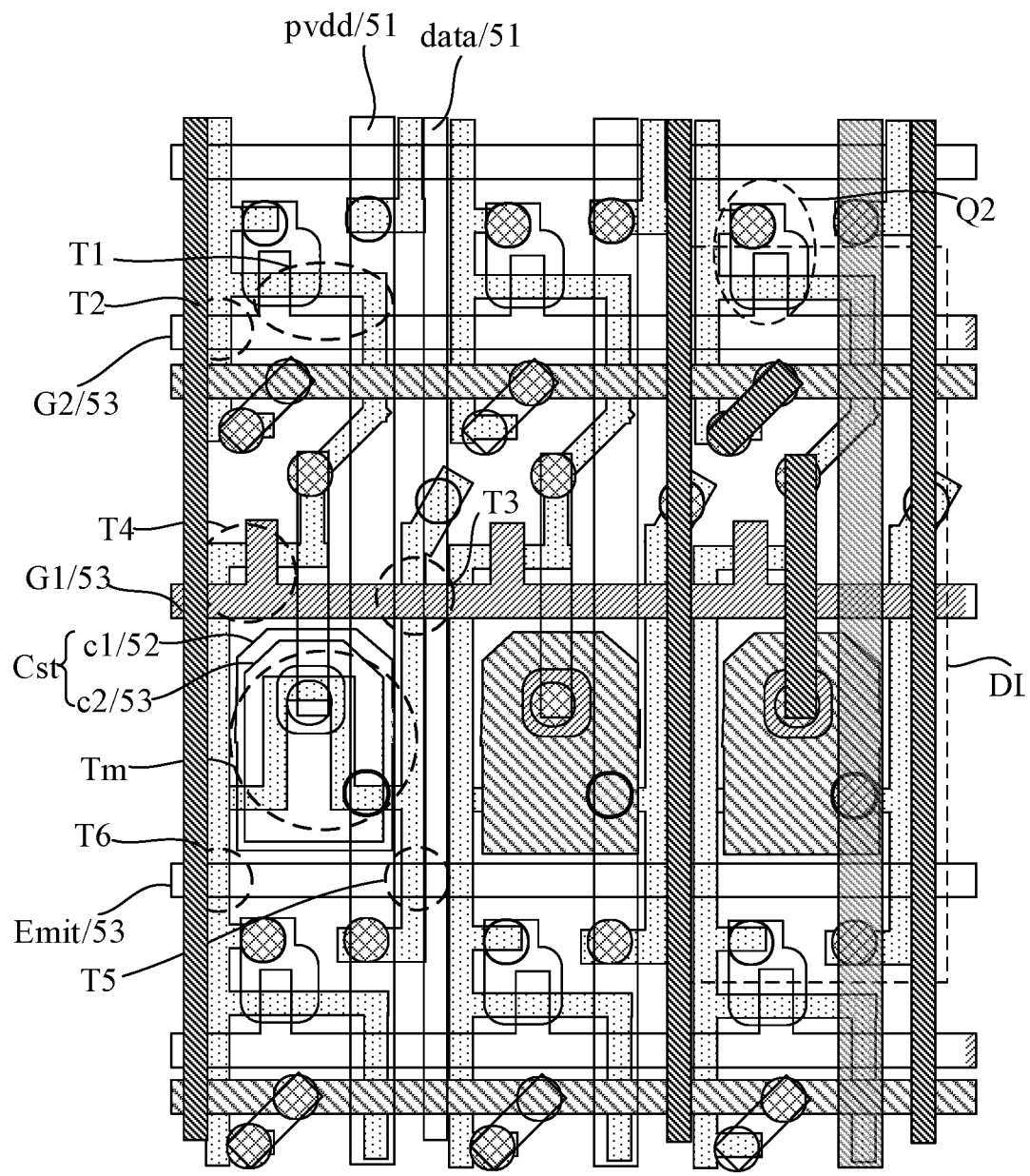
FIG. 13 is a schematic top view of a first display region in another display panel according to an embodiment of the present disclosure.
Figure 14:
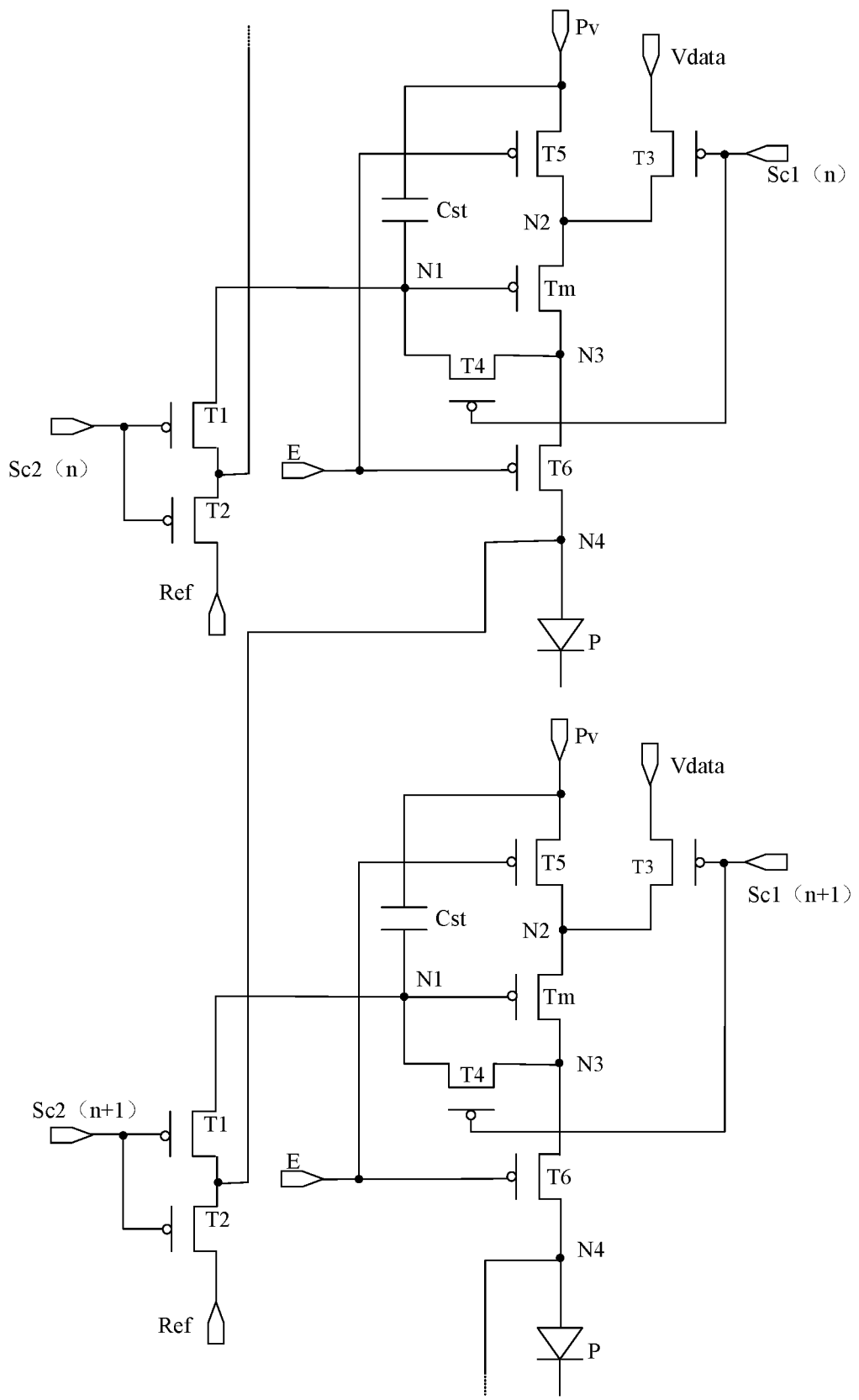
FIG. 14 is a schematic diagram of a pixel circuit in a display panel according to an embodiment of the present disclosure.
Figure 15:
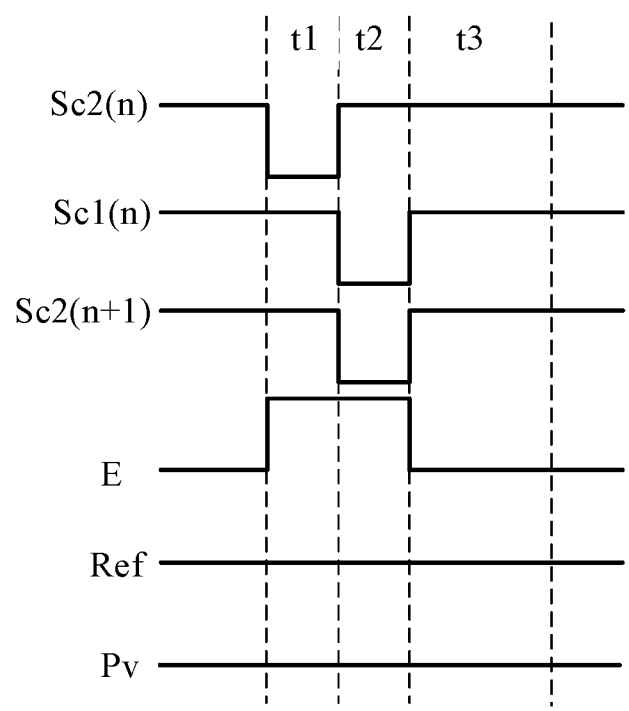
FIG. 15 is a sequence diagram of a pixel circuit according to an embodiment of the present disclosure.

In some implementations, FIG. 13 is a schematic top view of a first display region in another display panel according to an embodiment of the present disclosure. To make the structure of the pixel circuit in the schematic diagram clear, FIG. 13 schematically shows a top view seen from the pixel circuit layer to the substrate, and FIG. 14 is a schematic diagram of a pixel circuit in a display panel according to an embodiment of the present disclosure. FIG. 15 is a sequence diagram of a pixel circuit according to an embodiment of the present disclosure. FIG. 13 schematically shows the pixel circuits DL located in the first display region AA1, wherein the pixel circuits DL are used for driving the light-emitting devices to emit light. The structure of the pixel circuit DL is illustrated with reference to FIG. 13 and FIG. 14. The pixel circuit DL includes a drive transistor Tm, a gate reset transistor T1, an electrode reset transistor T2, a data writing transistor T3, a threshold compensation transistor T4, a first light-emitting control transistor T5, and a second light-emitting control transistor T6; the pixel circuit DL further includes a storage capacitor Cst. The storage capacitor Cst includes a first electrode c1 and a second electrode c2, wherein the first electrode c1 overlaps with the second electrode c2, the first electrode c1 is located in the second metal layer 52, and the second electrode c2 is located in the third metal layer 53. A region Q2 shown in FIG. 13 is equivalent to an output terminal of the pixel circuit DL, and the output terminal of the pixel circuit DL is connected to the first electrode 411 of the light-emitting device P. In addition, FIG. 13 shows that the first electrodes c1 of adjacent pixel circuits DL are independent of each other without being connected to each other. In some embodiments, the first electrodes c1 in adjacent pixel circuits DL are connected to each other, and this is not illustrated in the figure.

FIG. 14 shows connection relationships of the transistors in the pixel circuits DL. FIG. 14 shows a pixel circuit in the n-th row and a pixel circuit in the (n+1)-th row, wherein n is a positive integer. In the pixel circuit, the gate reset transistor T1 is coupled to a first node N1, a gate of the drive transistor Tm is coupled to the first node N1, a first electrode of the drive transistor Tm is coupled to a second node N2, and a second electrode of the drive transistor Tm is coupled to a third node N3. The drive transistor Tm is connected in series between the first light-emitting control transistor T5 and the second light-emitting control transistor T6. The data writing transistor T3 is coupled to the first node N1, and the threshold compensation transistor T4 is connected in series between the gate of the drive transistor Tm and the second electrode of the drive transistor Tm. The second electrode c2 of the storage capacitor Cst and one electrode of the first light-emitting control transistor T5 both receive a power signal Pv. The electrode reset transistor T2 and the first electrode 411 of the light-emitting device P are coupled to a fourth node N4. A gate of the gate reset transistor T1 and a gate of the electrode reset transistor T2 are coupled to a second scanning signal Sc2; a gate of the data writing transistor T3 and a gate of the threshold compensation transistor T4 are coupled to a first scanning signal Sc1; a gate of the first light-emitting control transistor T5 and a gate of the second light-emitting control transistor T6 are coupled to a light-emitting control signal E.

In the display panel, shift registers are used to provide scanning signals to the pixel circuits, and the shift registers are cascaded. An input terminal of the shift register in the n-th stage is connected to an output terminal of the shift register in the (n−1)-th stage, and an output terminal of the shift register in the n-th stage is connected to an input terminal of the shift register in the (n+1)-th stage. For the pixel circuit in the n-th row, the output terminal of the shift register in the (n−1)-th stage provides a second scanning signal Sc2 (n) to the pixel circuit in the n-th row, and the output terminal of the shift register in the n-th stage provides a first scanning signal Sc1 (n) to the pixel circuit in the n-th row. For the pixel circuit in the (n+1)-th row, the output terminal of the shift register in the n-th stage provides a second scanning signal Sc2 (n+1) to the pixel circuit in the (n+1)-th row, and the output terminal of the shift register in the (n+1)-th stage provides a first scanning signal Sc1 (n+1) to the pixel circuit in the (n+1)-th row. In other words, the first scanning signal Sc1 (n) received by the pixel circuit in the n-th row and the second scanning signal Sc2 (n+1) received by the pixel circuit in the (n+1)-th row are the same signal. Similarly, the second scanning signal Sc2 (n) received by the pixel circuit in the n-th row and the first scanning signal Sc1 (n−1) received by the pixel circuit in the (n−1)-th row are the same signal.

The pixel circuit in the (n+1)-th row is used as an example. In the pixel circuit in the (n+1)-th row: the gate of the gate reset transistor T1 and the gate of the electrode reset transistor T2 are coupled to the same control terminal, the first electrode of the electrode reset transistor T2 is coupled to a reset signal Ref, the first electrode of the gate reset transistor T1 is coupled to the second electrode of the electrode reset transistor T2, and the second electrode of the gate reset transistor T1 is coupled to the first node N1. Moreover, the second electrode of the electrode reset transistor T2 in the pixel circuit in the (n+1)-th row is further coupled to the fourth node N4 in the pixel circuit in the n-th row. After the gate reset transistor T1 and the electrode reset transistor T2 in the pixel circuit in the (n+1)-th row are turned on, the reset signal Ref is provided to the first node N1 to reset the gate of the drive transistor Tm; meanwhile, after the electrode reset transistor T2 is turned on, the reset signal Ref is further provided to the fourth node N4 of the pixel circuit in the n-th row, to reset the fourth node N4. FIG. 14 shows an example in which the transistors are p-type transistors. In the embodiments of the present disclosure, the transistors in the pixel circuit DL may also be n-type transistors.

Description is made with reference to the sequence diagram shown in FIG. 15. The working process of the pixel circuit DL in the n-th row is taken as an example for illustration. The pixel circuit includes the following working phases: a reset phase t1, a data writing phase t2, and a light-emitting phase t3. In the reset phase t1: the second scanning signal Sc2 (n) provides an enable signal to control the gate reset transistor T1 and the electrode reset transistor T2 to be turned on and provide the reset signal Ref to the first node N1, so as to reset the gate of the drive transistor Tm; meanwhile, after being turned on, the electrode reset transistor T2 provides the reset signal Ref to the fourth node N4 of the pixel circuit in the (n−1)-th row, so as to reset the light-emitting device P in the pixel circuit in the (n−1)-th row. In the data writing phase t2: the first scanning signal Sc1 (n) provides an enable signal to control the data writing transistor T3 and the threshold compensation transistor T4 to be turned on, and the data writing transistor T3 writes a data signal Vdata into the gate of the drive transistor Tm, the threshold compensation transistor T4 compensates a threshold voltage of the drive transistor Tm; in this phase, the electrode reset transistor T2 in the (n+1)-th row is turned on, to provide the reset signal Ref to the fourth node N4 in the pixel circuit in the n-th row, so as to reset the fourth node N4.

In the light-emitting phase t3: the light-emitting control signal E provides an enable signal to control the first light-emitting control transistor T5 and the second light-emitting control transistor T6 to be turned on, and the drive transistor Tm generates a driving current under the control of its gate potential.

Figure 16:
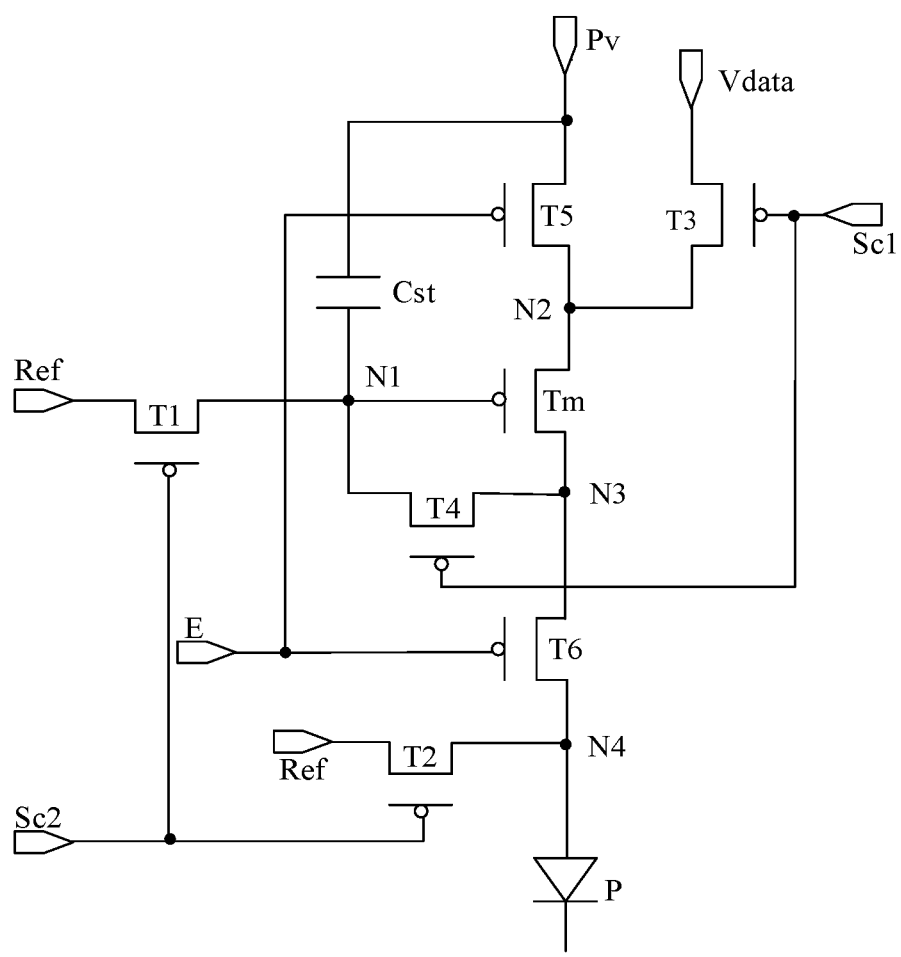
FIG. 16 is a schematic diagram of another pixel circuit according to an embodiment of the present disclosure.

FIG. 16 is a schematic diagram of another pixel circuit according to an embodiment of the present disclosure. As shown in FIG. 16, the gate of the gate reset transistor T1 and the gate of the electrode reset transistor T2 are coupled to the second scanning signal Sc2, the first electrode of the gate reset transistor T1 is coupled to the reset signal Ref, and the second electrode of the gate reset transistor T1 is coupled to the first node N1; the first electrode of the electrode reset transistor T2 is coupled to the reset signal Ref, and the second electrode of the electrode reset transistor T2 is coupled to the fourth node N4. When the pixel circuit works in the reset phase, the second scanning signal Sc2 provides an enable signal to control the gate reset transistor T1 and the electrode reset transistor T2 to be turned on simultaneously; after being turned on, the gate reset transistor T1 resets the first node N1; after being turned on, the electrode reset transistor T2 resets the fourth node N4. In this implementation, the gate of the drive transistor Tm and the light-emitting device P are reset simultaneously.

The pixel circuits in the embodiments shown in FIG. 14 and FIG. 16 are representative examples, and are not intended to limit the embodiments of the present disclosure. The pixel circuits in the display panel provided by the embodiments of the present disclosure may be any type of pixel circuits in the prior art.

Figure 17:
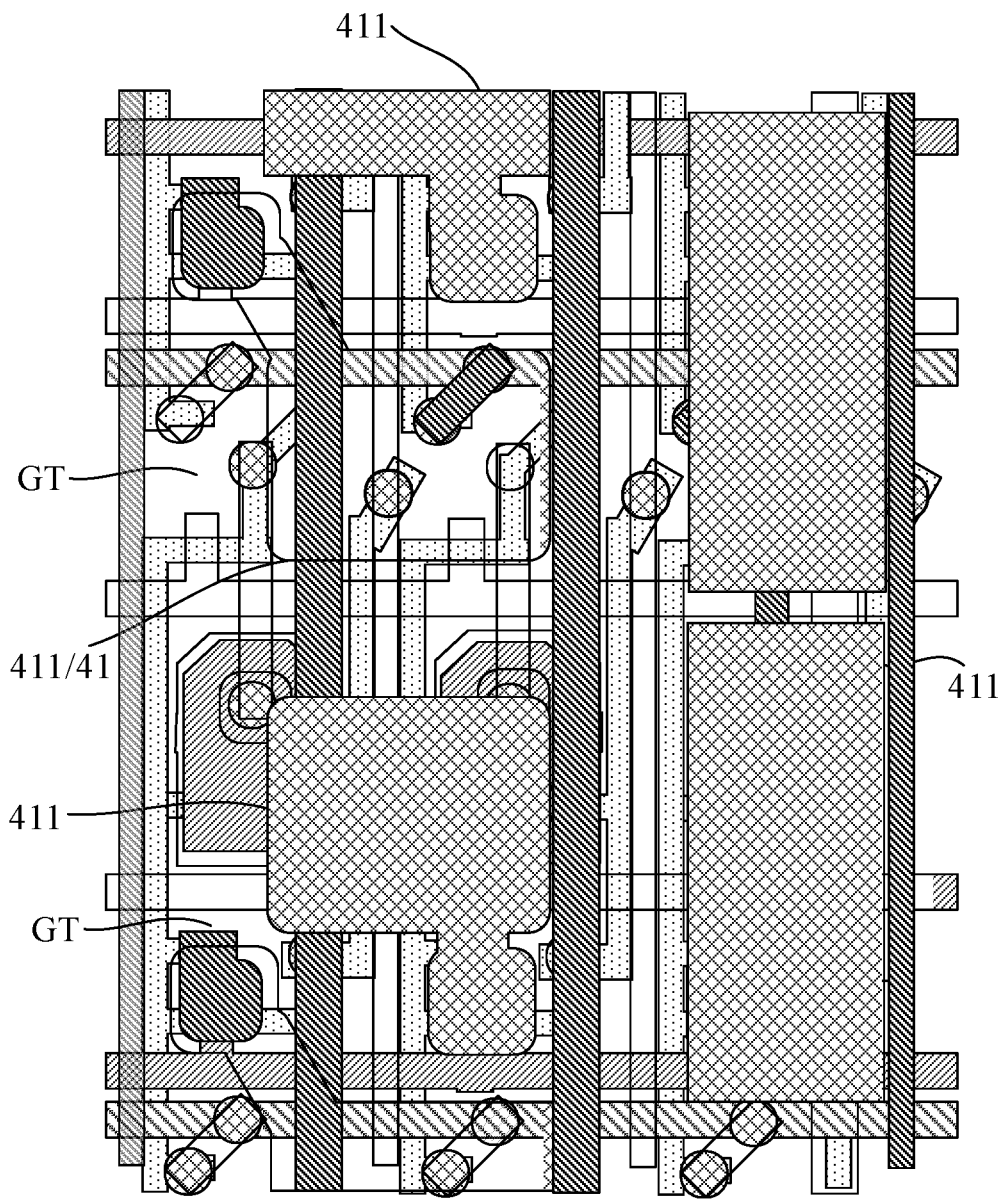
FIG. 17 is a schematic top view of a first display region in another display panel according to an embodiment of the present disclosure.

FIG. 17 is a schematic top view of a first display region in another display panel according to an embodiment of the present disclosure. FIG. 17 schematically shows a top view seen from the first electrode layer to the substrate, and FIG. 17 shows a patterned first electrode 411 of the light-emitting device, wherein the first electrode 411 is located in the first electrode layer 41. It can be seen that an output terminal of one pixel circuit is connected to one first electrode 411. The first electrode 411 in the first display region AA1 is a reflecting electrode. A manufacturing material of the first electrode 411 includes a metal material, and therefore, the first electrode 411 belongs to a metal structure above the substrate 10. In addition, all transistors in the pixel circuit DL, except for the semiconductor layer, are made of a metal material. Therefore, the first display region AA1 includes the metal structure located above the substrate 10. FIG. 17 shows high-light-transmittance regions GT in the first display region AA1. It can be understood that, the top view direction is perpendicular to the plane in which the substrate 10 is located. It can be seen from FIG. 17 that, in the direction perpendicular to the plane in which the substrate 10 is located, the high-light-transmittance region GT does not overlap with the metal structure. Therefore, after entering the high-light-transmittance region GT, light will not be reflected by the metal structure, and the light can directly penetrate the display panel through the high-light-transmittance region GT.

Figure 18:
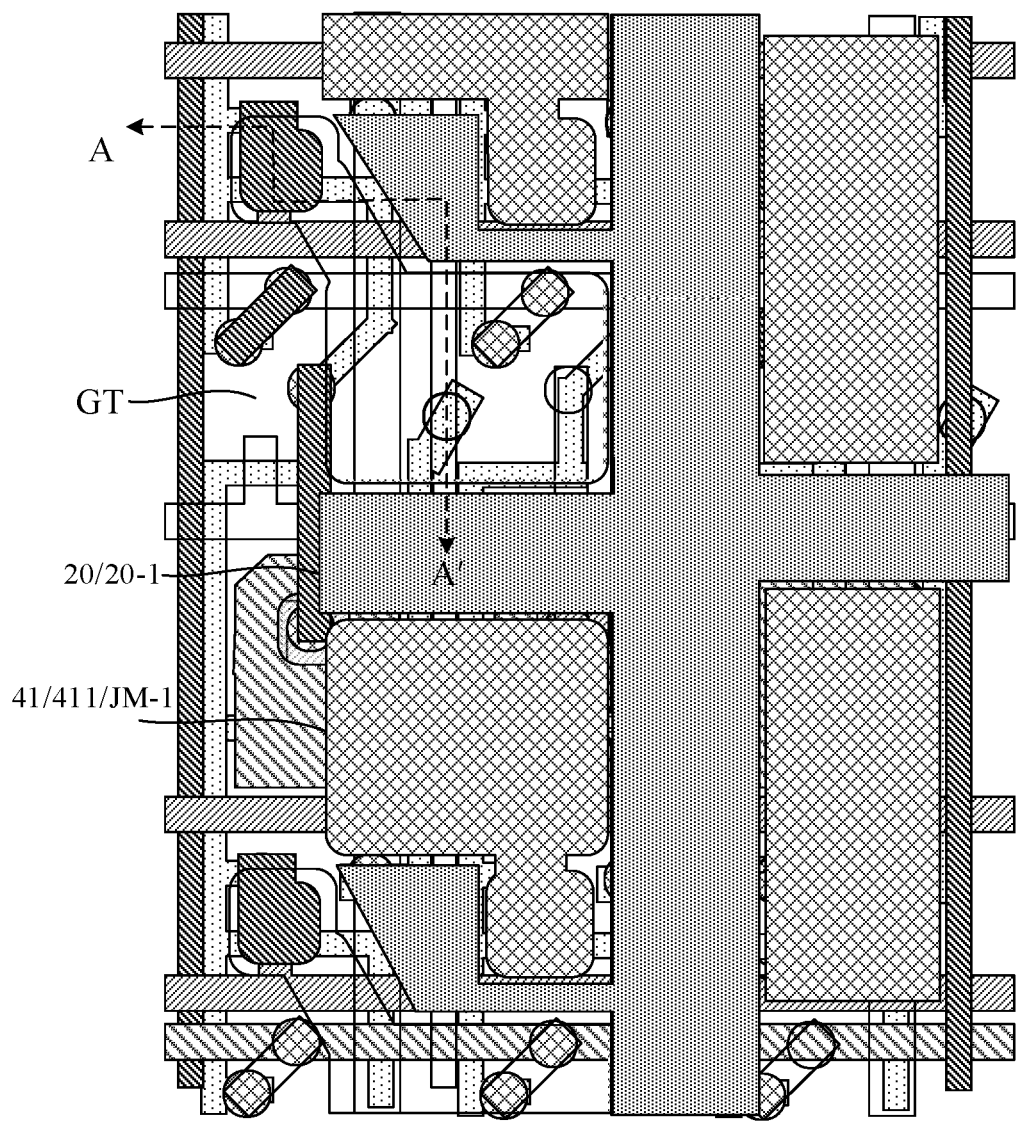
FIG. 18 is a schematic top view of a first display region in another display panel according to an embodiment of the present disclosure.

FIG. 18 is a schematic top view of a first display region in another display panel according to an embodiment of the present disclosure, wherein the top view is seen from the microstructure towards the substrate. As shown in FIG. 18, in the direction perpendicular to the plane in which the substrate 10 is located, the microstructure 20 does not overlap with at least part of the high-light-transmittance region GT. It can be learned from the related description in the embodiment shown in FIG. 5 that, when light is incident on the first interface M1 for contact between the microstructure 20 and the optical auxiliary structure 30, the light will be reflected and thus the propagation direction is changed. In this embodiment of the present disclosure, the microstructure 20 does not overlap with at least part of the high-light-transmittance region GT, so that light can directly penetrate the display panel through the high-light-transmittance region GT, to prevent the first interface M1 from affecting the propagation direction of this part of light.

Figure 19:
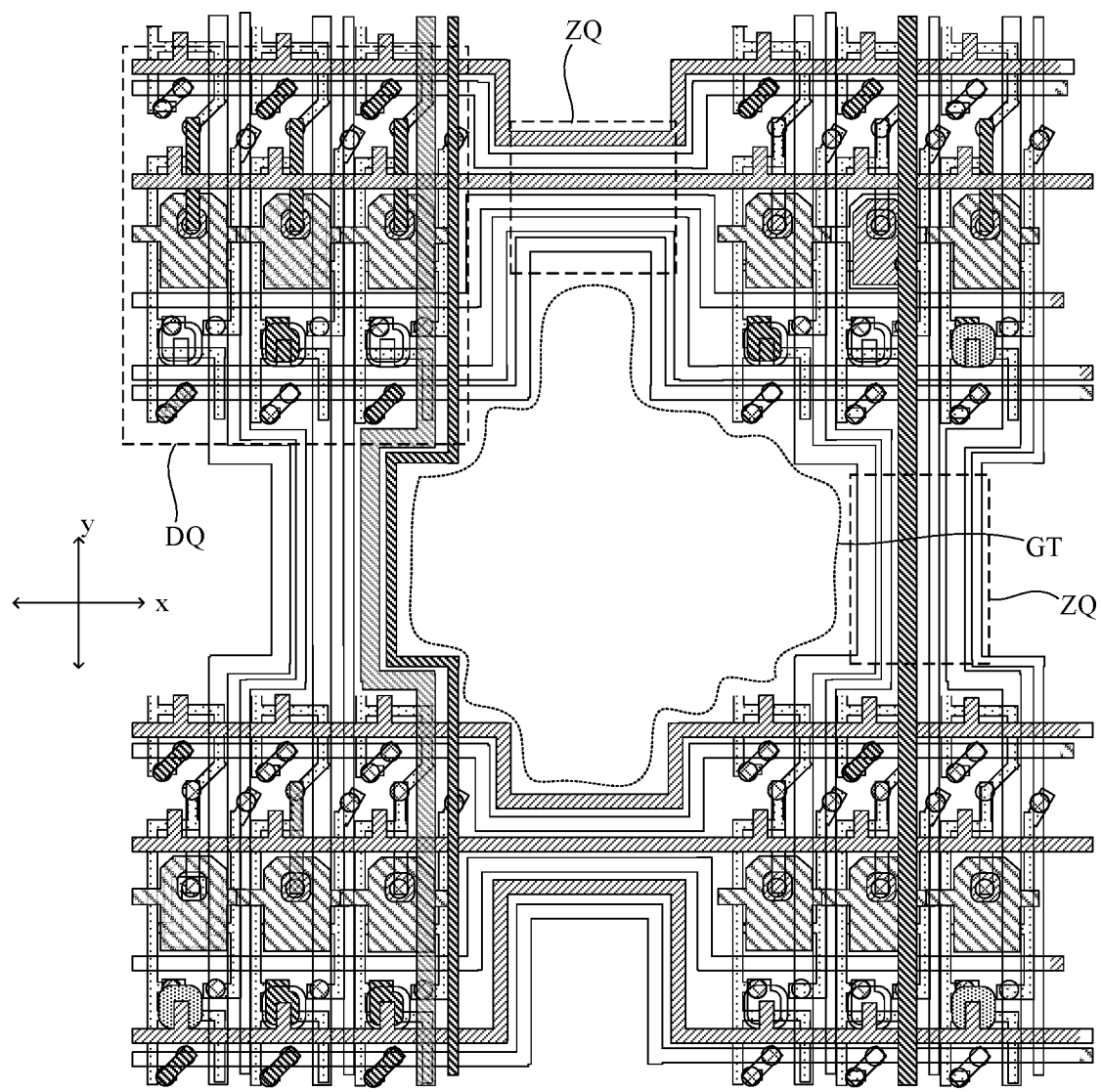
FIG. 19 is a partial schematic view of a pixel circuit layer in a first display region of another display panel according to an embodiment of the present disclosure.

In other embodiments, FIG. 19 is a partial schematic view of a pixel circuit layer in a first display region of another display panel according to an embodiment of the present disclosure. FIG. 19 shows circuit regions DQ and wiring regions ZQ. For example, three pixel circuits are arranged in a circuit region DQ, and for the structure of the pixel circuit, reference may be made to FIG. 13. The wiring region ZQ is located between two adjacent circuit regions DQ and lines for connecting the two circuit regions DQ are all disposed in the wiring region ZQ. In the first display region AA1, some pixel circuit in the pixel circuits arranged in a row direction x are removed, to form the circuit region DQ arranged in the row direction x as shown in FIG. 19; some pixel circuits in the pixel circuits arranged in a column direction y are removed, to form the circuit regions DQ arranged in the column direction y. In the same direction, a distance between two adjacent lines in the wiring region ZQ is less than a distance between two adjacent lines in the circuit region DQ. As shown in a high-light-transmittance region GT jointly defined by four circuit regions DQ and four wiring regions ZQ in FIG. 19, no metal line or transistor is disposed in the high-light-transmittance region GT; therefore, light will not be shielded by the metal structure when passing through the high-light-transmittance region GT. In this embodiment of the present disclosure, the microstructure 20 does not overlap with the high-light-transmittance region GT.

The embodiment of FIG. 19 does not show the light-emitting devices in the first display region AA1. In some implementations, one pixel circuit in the first display region AA1 drives one light-emitting device; in other implementations, one pixel circuit in the first display region AA1 drives two or more light-emitting devices, which is not illustrated herein.

Figure 20:
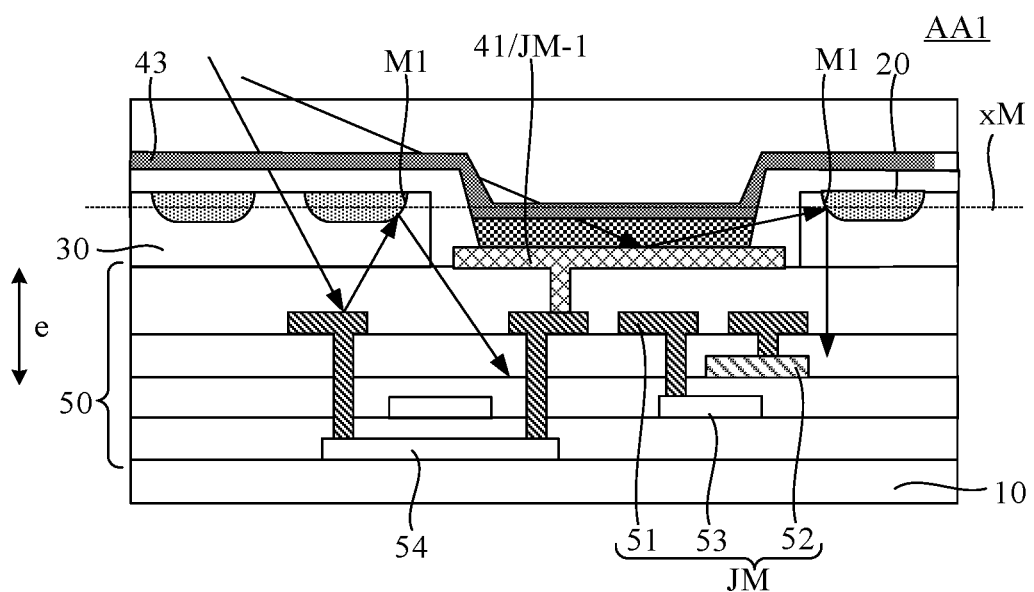
FIG. 20 is a schematic cross-sectional view of a first display region of another display panel according to an embodiment of the present disclosure.

In some embodiments, FIG. 20 is a schematic cross-sectional view of a first display region of another display panel according to an embodiment of the present disclosure. As shown in FIG. 20, the first display region AA1 includes a metal structure JM located on the same side of the substrate 10 as the microstructure 20, wherein structures that are above the substrate 10 and located in the first metal layer 51, in the second metal layer 52, in the third metal layer 53, and in the first electrode layer 41 all belong to the metal structure JM. The metal structure JM includes a first metal structure JM-1. The microstructures 20 and at least some of the optical auxiliary structures 30 in contact with the microstructures 20 are located on the same side of the first metal structure JM-1 that is away from the substrate 10. That is, during manufacturing of the display panel, the optical auxiliary structures 30 and the microstructures 20 are manufactured after the first metal structure JM-1 is manufactured, so that the microstructure 20 is embedded in a side of the optical auxiliary structure 30 that is away from the substrate 10. With such a configuration, when light entering the first display region AA1 is reflected on a side of the first metal structure JM-1 that is away from the substrate 10, part of the light after reflection will be reflected again on the first interface M1 for contact between the microstructure 20 and the optical auxiliary structure 30, to propagate towards the substrate 10, thereby increasing the probability of the reflected light being emitted from the back side of the display panel, which helps improve the light transmittance of the first display region AA1.

When other metal structures JM are further disposed on a side of the first metal structure JM-1 that is close to the substrate 10, that is, when metal structures JM are further disclosed between the first metal layer JM-1 and the substrate 10, the first interface formed between the microstructure 20 and the optical auxiliary structure 30 on a side of the first metal structure JM-1 that is away from the substrate 10 can also act on light reflected by the metal structures between the first metal structure JM-1 and the substrate 10.

Figure 21:
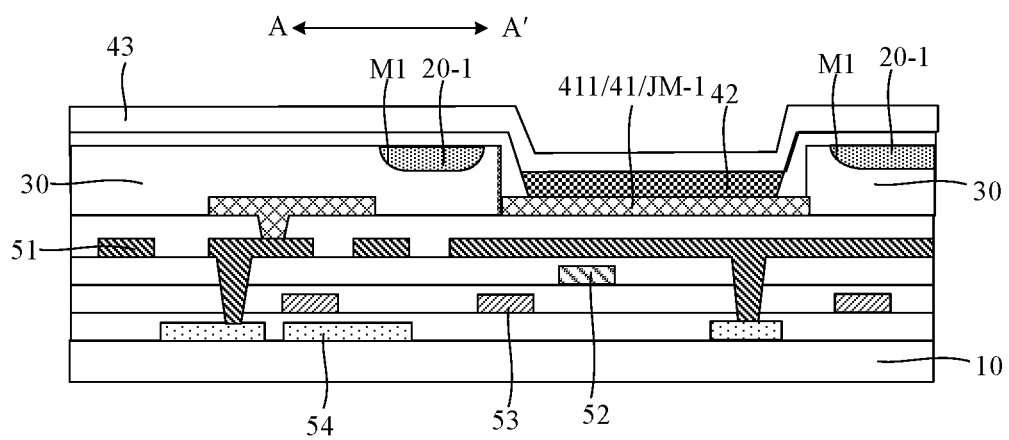
FIG. 21 is a schematic cross-sectional view along a line A-A' in FIG. 18.

In some implementations, FIG. 21 is a schematic cross-sectional view along a line A-A' in FIG. 18. As shown in FIG. 21, the first electrode layer 41 includes a first metal structure JM-1. The first electrode layer 41 includes a plurality of patterned first electrodes 411 (only one is shown in FIG. 21), and the first electrode 411 is one electrode of the light-emitting device P. The first electrode 411 is a reflecting electrode. In this embodiment of the present disclosure, the first electrode of the light-emitting device P is the first metal structure JM-1. The microstructure 20 includes a first microstructure 20-1, wherein the first microstructure 20-1 is located on a side of the first electrode layer 41 that is away from the substrate 10. Because the first electrode 411 of the light-emitting device is located in the first electrode layer 41, the metal structure in the first electrode layer 41 has a relatively large area, and the first electrode layer 41 reflects a relatively large amount of ambient light in the first display region AA1. The first microstructure 20-1 is disposed on a side of the first electrode layer 41 that is away from the substrate 10, i.e., the first microstructure 20-1 is manufactured after the first electrode layer 41 is manufactured. The first interface M1 for contact between the first microstructure 20-1 and the optical auxiliary structure 30 can be used to act on light reflected by the first electrode layer 41, and the first interface M1 can further act on light reflected by other metal layers between the first electrode layer 41 and the substrate 10. Part of light changes the direction under the action of the first interface M1, propagates towards the substrate 10, and is finally emitted from the back side of the display panel, thereby improving the light transmittance of the first display region AA1.

With reference to FIG. 18 and FIG. 21, in this implementation, the first microstructure 20-1 does not overlap with the first electrode layer 41. In other implementations, the first microstructure 20-1 may partially overlap with the first electrode layer 41, which is not illustrated herein.

As shown in FIG. 18, at least one first microstructure 20-1 is arranged along a circumferential direction of the first metal structure JM-1. That is, the first microstructure 20-1 is arranged along a circumferential direction of the first electrode 411. In some embodiments, two or more first microstructures 20-1 are arranged along the circumferential direction of the first metal structure JM-1. With such a configuration, the first interface M1 for contact between the first microstructure 20-1 and the optical auxiliary structure 30 can be used to reflect again light reflected by the first metal structure JM-1; by arranging the first microstructure 20-1 on the periphery of the first metal structure JM-1, the probability of the light reflected by the first metal structure JM-1 being transmitted to the first interface M1 is increased, thereby helping to improve the light transmittance of the first display region AA1.

In other implementations, the microstructure 20 is located on a side of the first electrode layer 41 that is close to the substrate 10. In this implementation, the first interlace M1 for contact between the microstructure 20 and the optical auxiliary structure 30 can act on part of light reflected by the metal structure between the microstructure 20 and the substrate 10, so that this part of light propagates towards the substrate 10 after being reflected, and is emitted from the back side of the display panel, thereby improving the light transmittance of the first display region AA1. In this implementation, the microstructure 20 is disposed between the light-emitting device layer 40 and the substrate 10, which will not affect the structure of the light-emitting device layer 40 and does not change the manufacturing process of the light-emitting device layer 40.

Figure 22:
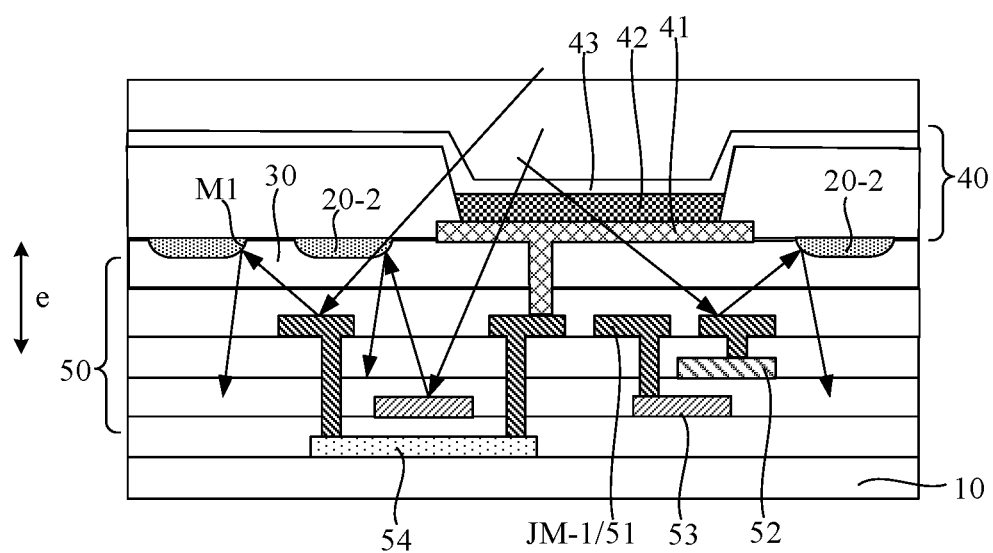
FIG. 22 is a schematic cross-sectional view of a first display region of another display panel according to an embodiment of the present disclosure.

In some embodiments, FIG. 22 is a schematic cross-sectional view of a first display region of another display panel according to an embodiment of the present disclosure. As shown in FIG. 22, the pixel circuit layer 50 includes a first metal layer 51, a second metal layer 52, a third metal layer 53, and a semiconductor layer 54. The first metal layer 51 includes a first metal structure JM-1. In some implementations, the data line data (referring to FIG. 13) in the display panel and the power signal line pvdd (referring to FIG. 13) are located in the first metal layer 51, and therefore the data line data and the power signal line pvdd are the first metal structure JM-1. One terminal of the data writing transistor T3 is electrically connected to the data line data, and the data line data is used for providing a data signal to the pixel circuit DL. The second electrode c2 of the storage capacitor Cst is electrically connected to the power signal line pvdd, one terminal of the first light-emitting control transistor T5 is electrically connected to the power signal line pvdd, and the power signal line pvdd provides a power signal.

The microstructure 20 includes a second microstructure 20-2, wherein the second microstructure 20-2 is located on a side of the first metal layer 51 that is close to the light-emitting device layer 40. That is, in the direction e perpendicular to the plane in which the substrate 10 is located, the second microstructure 20-2 is located between the first electrode layer 41 and the first metal layer 51. In this implementation, the first interface M1 for contact between the second microstructure 20-2 and the optical auxiliary structure 30 can act on part of light reflected by the first metal layer 51, so that this part of light propagates towards the substrate 10 after being reflected by the first interface M1, and is finally emitted from the back side of the display panel, thereby improving the light transmittance of the first display region AA1. Moreover, the first interface M1 for contact between the second microstructure 20-2 and the optical auxiliary structure 30 can further act on part of light reflected by the metal structure between the first metal layer 51 and the substrate 10, which can increase the amount of light transmitted to the first interface M1, and thus increase the amount of light emitted from the back side of the display panel after the direction is changed under the action of the first interface M1, thereby improving the light transmittance of the first display region AA1.

In some embodiments, a planarization layer is disposed between the first metal layer 51 and the light-emitting device layer 40. The planarization layer achieves a planarization function, to provide a relatively flat base for the manufacturing of the light-emitting device layer 40. The planarization layer is reused as the optical auxiliary structure 30. That is, the microstructure 20 is embedded in a side of the planarization layer that is away from the substrate 10. In this way, it is unnecessary to manufacture an additional optical auxiliary layer 30 in the display panel, thereby simplifying the process and helping to reduce the thickness of the display panel.

Figure 23:
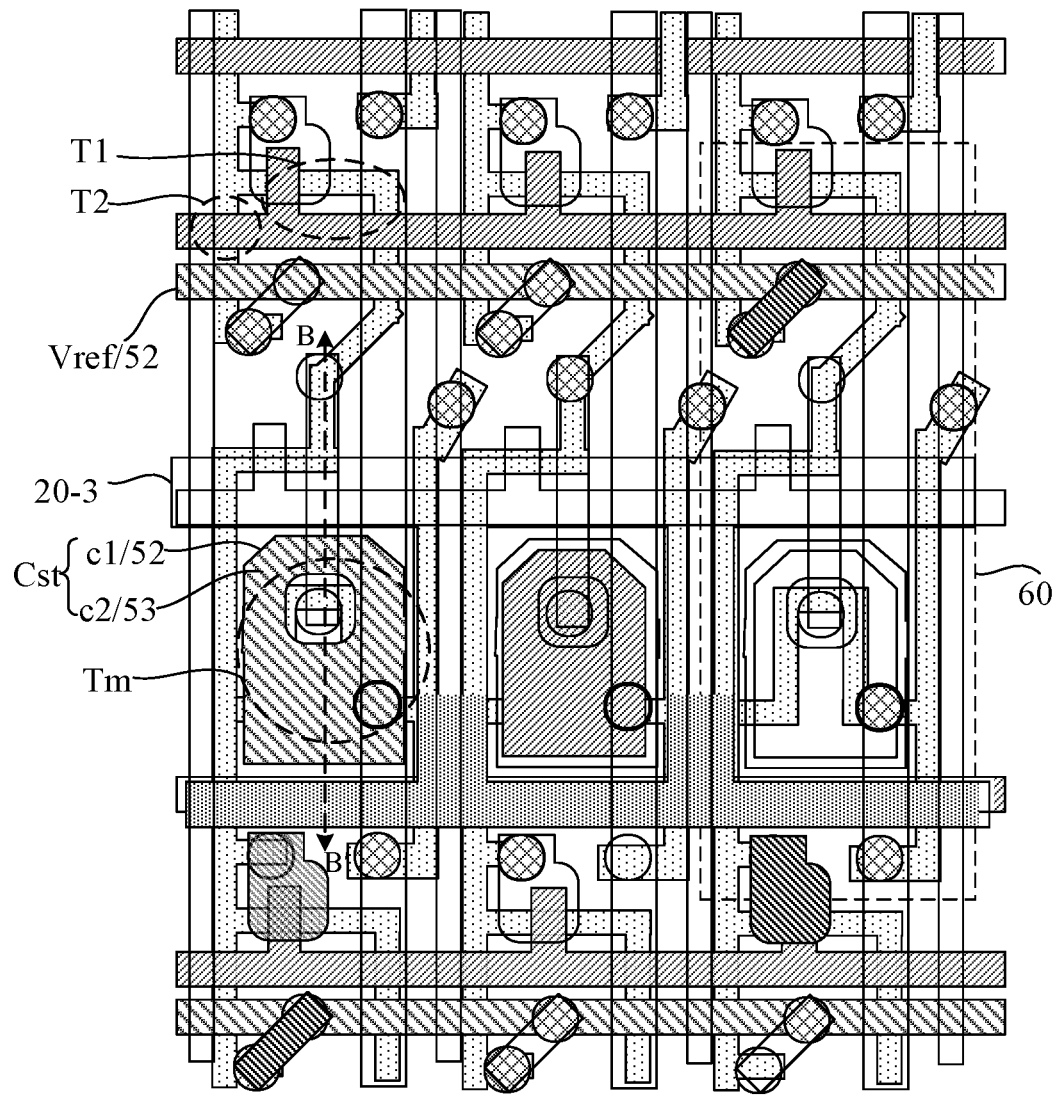
FIG. 23 is a schematic top view of a first display region of another display panel according to an embodiment of the present disclosure.
Figure 24:
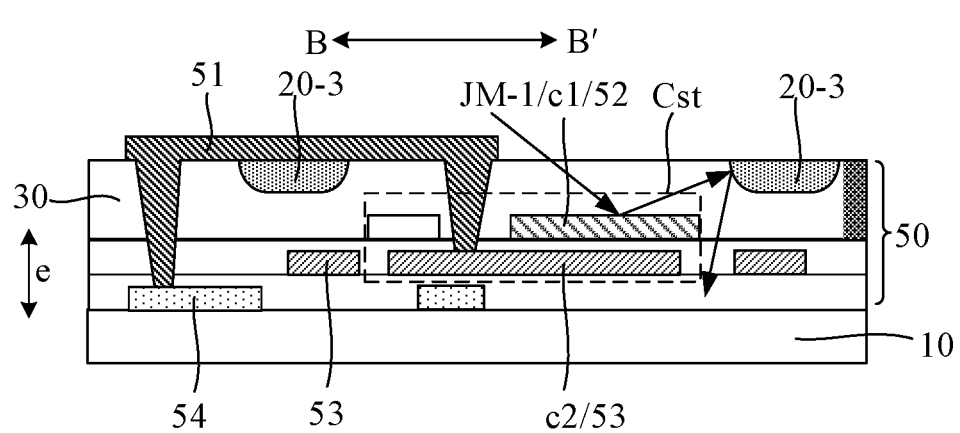
FIG. 24 is a schematic cross-sectional view along a line B-B' in FIG. 23.

In other embodiments, FIG. 23 is a schematic top view of a first display region of another display panel according to an embodiment of the present disclosure, wherein the top view is seen from the pixel circuit layer to the substrate. FIG. 24 is a schematic cross-sectional view along a line B-B' in FIG. 23. With reference to FIG. 23 and FIG. 24, the pixel circuit layer 50 includes a first metal layer 51, a second metal layer 52, a third metal layer 53, and a semiconductor layer 54; the second metal layer 52 is located on a side of the first metal layer 51 that is close to the substrate 10, and the third metal layer 53 is located on a side of the second metal layer 52 that is close to the substrate 10. The second metal layer 52 includes a first metal structure JM-1. The second metal layer 52 includes a first electrode c1, and the third metal layer 53 includes a second electrode c2; in the direction e perpendicular to the plane in which the substrate 10 is located, the first electrode c1 and the second electrode c2 overlap with each other to form a storage capacitor Cst. In this case, the first electrode c1 is the first metal structure JM-1. The microstructure includes a third microstructure 20-3, wherein the third microstructure 20-3 is located on a side of the second metal layer 52 that is close to the first metal layer 51. That is, in the direction perpendicular to the plane in which the substrate 10 is located, the third microstructure 20-3 is located between the second metal layer 52 and the first metal layer 51. In the pixel circuit layer 50, the first electrode c1 of the storage capacitor Cst has a relatively large area, and therefore the first electrode c1 can reflect a relatively large amount of light. By setting the third microstructure 20-3 on a side of the second metal layer 52 that is close to the first metal layer 51, the first interface M1 for contact between the third microstructure 20-3 and the optical auxiliary structure 30 can act on part of light reflected by the second metal layer 52, so that this part of light propagates towards the substrate 10 after being reflected by the first interface M1, and is emitted from the back side of the display panel, thereby improving the light transmittance of the first display region AA1. Moreover, the first interface M1 for contact between the third microstructure 20-3 and the optical auxiliary structure 30 can further act on part of light reflected by the metal structure between the second metal layer 52 and the substrate 10, which can increase the amount of light transmitted to the first interface M1 and thus increase the amount of light emitted from the back side of the display panel after the direction is changed under the action of the first interface M1, thereby improving the light transmittance of the first display region AA1.

It can be seen from FIG. 23 that, the third microstructure 20-3 is arranged along a circumferential direction of the first electrode c1.

As shown in FIG. 23, the pixel circuit layer 50 further includes a reset signal line Vref, wherein one electrode of the gate reset transistor T1 and one electrode of the electrode reset transistor T2 are both connected to the reset signal line Vref, and the reset signal line Vref is used for providing a reset signal. The reset signal line Vref is located in the second metal layer 52, and the reset signal line Vref also belongs to the first metal structure JM-1 in the second metal layer 52. In some embodiments, the third microstructure 20-3 is also disposed around the reset signal line Vref, so that the first interface M1 for contact between the third microstructure 20-3 and the optical auxiliary structure 30 is used to act on part of light reflected by the reset signal line Vref, thereby further improving the light transmittance of the first display region AA1.

Figure 25:
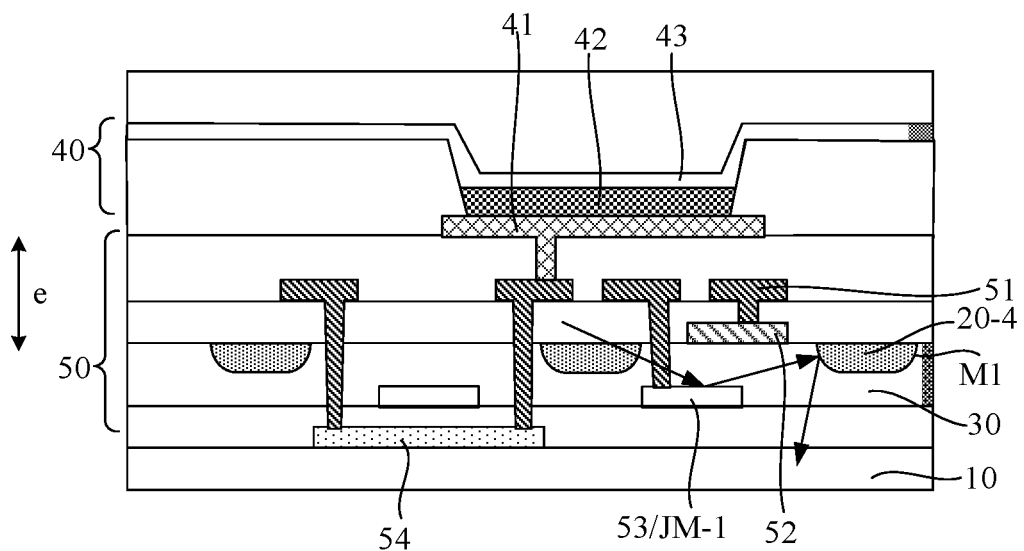
FIG. 25 is a schematic cross-sectional view of a first display region of another display panel according to an embodiment of the present disclosure.

In other embodiments, FIG. 25 is a schematic cross-sectional view of a first display region of another display panel according to an embodiment of the present disclosure. As shown in FIG. 25, the pixel circuit layer 50 includes a first metal layer 51, a second metal layer 52, a third metal layer 53, and a semiconductor layer 54. The first metal layer 51 is a metal layer that is closest to the light-emitting device layer 40 in the direction e perpendicular to the plane in which the substrate 10 is located. A first electrode of the storage capacitor in the pixel circuit is located at the second metal layer 52, and a second electrode of the storage capacitor is located at the third metal layer 53. The third metal layer 53 includes a first metal structure JM-1. The microstructure 20 includes a fourth microstructure 20-4, and the fourth microstructure 20-4 is located on a side of the third metal layer 53 that is close to the second metal layer 52. That is, in the direction e perpendicular to the plane in which the substrate 10 is located, the fourth microstructure 20-4 is located between the third metal layer 53 and the second metal layer 52. The first interface M1 for contact between the fourth microstructure 20-4 and the optical auxiliary structure 30 can act on part of light reflected by the third metal layer 53, so that this part of light propagates towards the substrate 10 after being reflected by the first interface M1, and is emitted from the back side of the display panel, thereby improving the light transmittance of the first display region AA1.

The second electrode as well as the first scanning line G1, the second scanning line G2, and the light-emitting control line Emit in the pixel circuit are disposed in the third metal layer 53. Referring to FIG. 13, a control terminal of the data writing transistor T3 and a control terminal of the threshold compensation transistor T4 are both electrically connected to the first scanning line G1; a control terminal of the first light-emitting control transistor T5 and a control terminal of the second light-emitting control transistor T6 are both electrically connected to the light-emitting control line Emit; a control terminal of the gate reset transistor T1 and a control terminal of the electrode reset transistor T2 are both electrically connected to the second scanning line G2. The first scanning line G1, the second scanning line G2, and the light-emitting control line Emit all belong to the first metal structure JM-1. The fourth microstructures 20-4 may be arranged on the peripheries of the first scanning line G1, the second scanning line G2, and the light-emitting control line Emit respectively, so that the first interface M1 for contact between the fourth microstructure 20-4 and the optical auxiliary structure 30 is used to reflect part of light, to improve the light transmittance of the first display region AA1.

Figure 26:
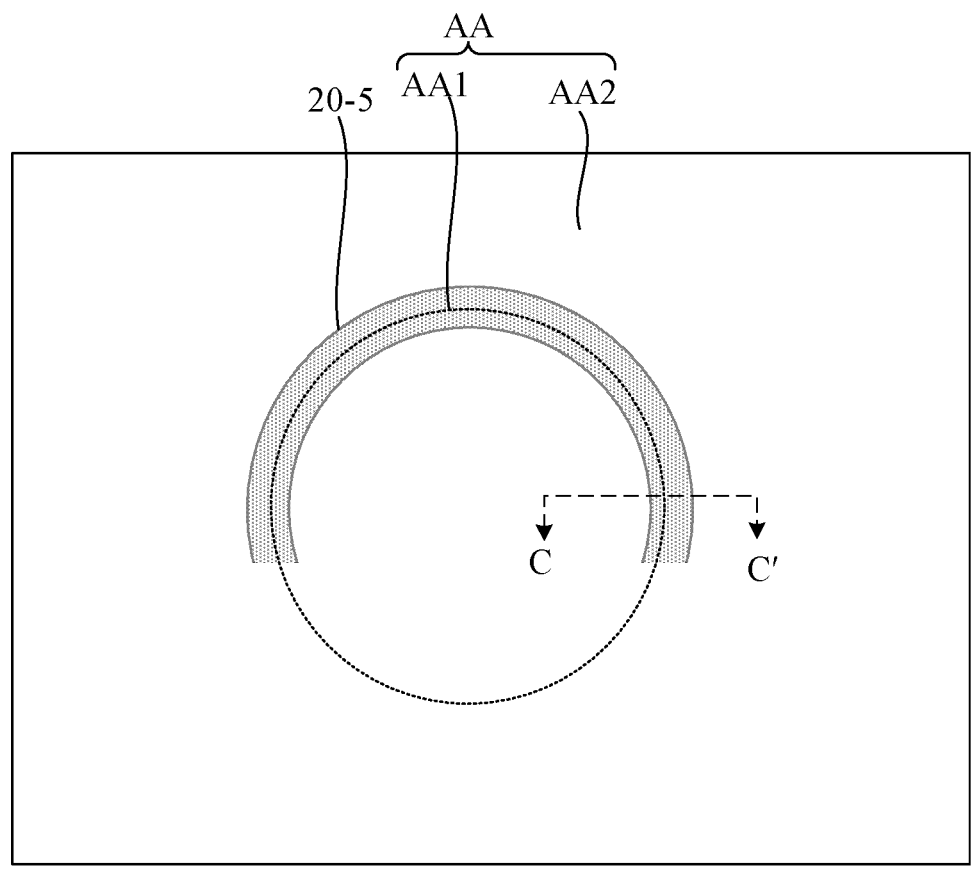
FIG. 26 is a schematic diagram of another display panel according to an embodiment of the present disclosure.
Figure 27:
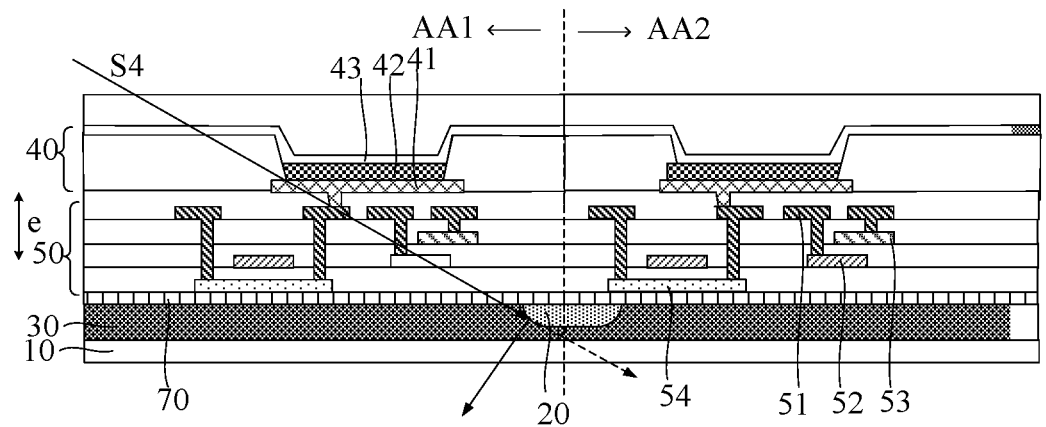
FIG. 27 is a schematic cross-sectional view along a line C-C' in FIG. 26.

In other embodiments, FIG. 26 is a schematic diagram of another display panel according to an embodiment of the present disclosure; FIG. 27 is a schematic cross-sectional view along a line C-C' in FIG. 26. As shown in FIG. 26, the microstructure 20 further includes a fifth microstructure 20-5, and at least one fifth microstructure 20-5 is arranged along the edge of the first display region AA1. The edge of the first display region AA1 is a virtual boundary between the first display region AA1 and the second display region AA2. The fifth microstructure 20-5 is arranged along the edge of the first display region AA1, and at least part of the fifth microstructure 20-5 is located in the first display region AA1. As shown in FIG. 27, large-angle light S4 transmitted to the edge of the first display region AA1 has a relatively large acute angle with the direction e perpendicular to the plane in which the substrate 10 is located, and will be finally emitted from the back side corresponding second display region AA2 if propagating along its original optical path. Through the fifth microstructure 20-5 in this embodiment of the present disclosure, after being incident on the first interface (not marked in FIG. 27) for contact between the fifth microstructure 20-5 and the optical auxiliary structure 30, the light S4 will be reflected by the first interlace and thus the optical path thereof is changed, so that the reflected light is finally emitted from the back side corresponding to the first display region AA1, thereby contributing to light emitting of the first display region AA1 and improving the light transmittance of the first display region AA1. Moreover, the fifth microstructure 20-5 is arranged along the edge of the first display region AA1, so that large-angle light incident on the edge of the first display region AA1 from different directions can all be used and emitted from the back side corresponding to the first display region AA1, thereby improving the light transmittance of the first display region AA1.

Figure 28:
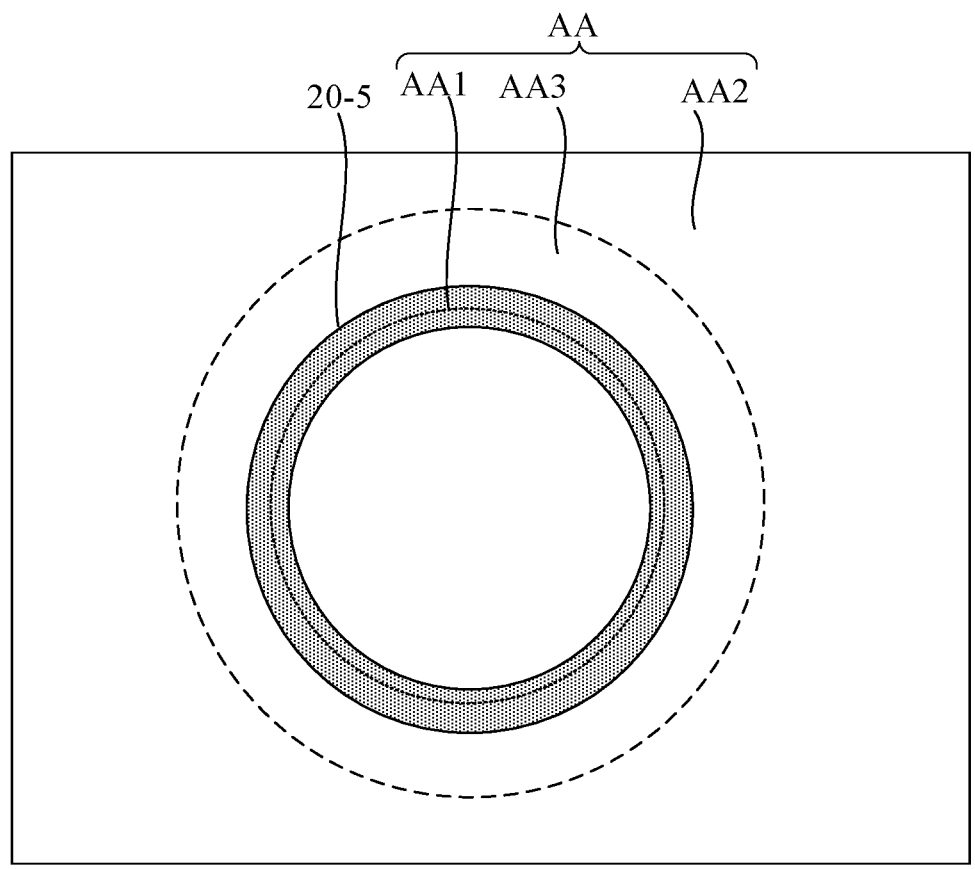
FIG. 28 is a schematic diagram of another display panel according to an embodiment of the present disclosure.

In some embodiments. FIG. 28 is a schematic diagram of another display panel according to an embodiment of the present disclosure. As shown in FIG. 28, the display region AA further includes a transition region AA3, wherein the transition region AA3 is located between the first display region AA1 and the second display region AA2. In this implementation, the fifth microstructure 20-5 is arranged along the virtual boundary between the first display region AA1 and the transition region AA3.

In some embodiments, the density of light-emitting devices disposed in the transition region AA3 is greater than the density of light-emitting devices disposed in the first display region AA1, and is less than the density of light-emitting devices disposed in the second display region AA2. The transition region AA3 can improve the display effect of the display region A, so that the display transition between the first display region AA1 and the second display region AA2 is more natural.

In other embodiments, pixel circuits DL for driving the light-emitting devices P in the first display region AA1 are located in the transition region AA3. In this way, the light transmittance of the first display region AA1 can be improved.

As shown in FIG. 27, the display panel further includes a buffer layer 70 located on a side of the substrate 10; the pixel circuit layer 50 is located on a side of the buffer layer 70 that is close to the light-emitting device layer 40; and the buffer layer 70 is used for heat preservation in a subsequent excimer laser annealing process for forming the semiconductor layer 54. The fifth microstructure 20-5 is located on a side of the buffer layer 70 that is close to the substrate 10. The first interface for contact between the fifth microstructure 20-5 and the optical auxiliary structure 30 can act on large-angle light incident on the edge of the first display region AA1, so that the light is emitted from the back side of the display panel corresponding to the first display region AA1 after its optical path is changed, thereby improving the light transmittance of the first display region AA1. Moreover, the fifth microstructure 20-5 is arranged on a side of the buffer layer 70 that is close to the substrate 10, which does not affect the manufacturing process of the pixel circuit layer 50 and the light-emitting device layer 40. In addition, with such a configuration, in the direction e perpendicular to the plane in which the substrate 10 is located, the fifth microstructure 20-5 is relatively close to the back side of the display panel, and the light with the changed optical path can be emitted from the display panel after passing through a relatively short distance.

Figure 29:
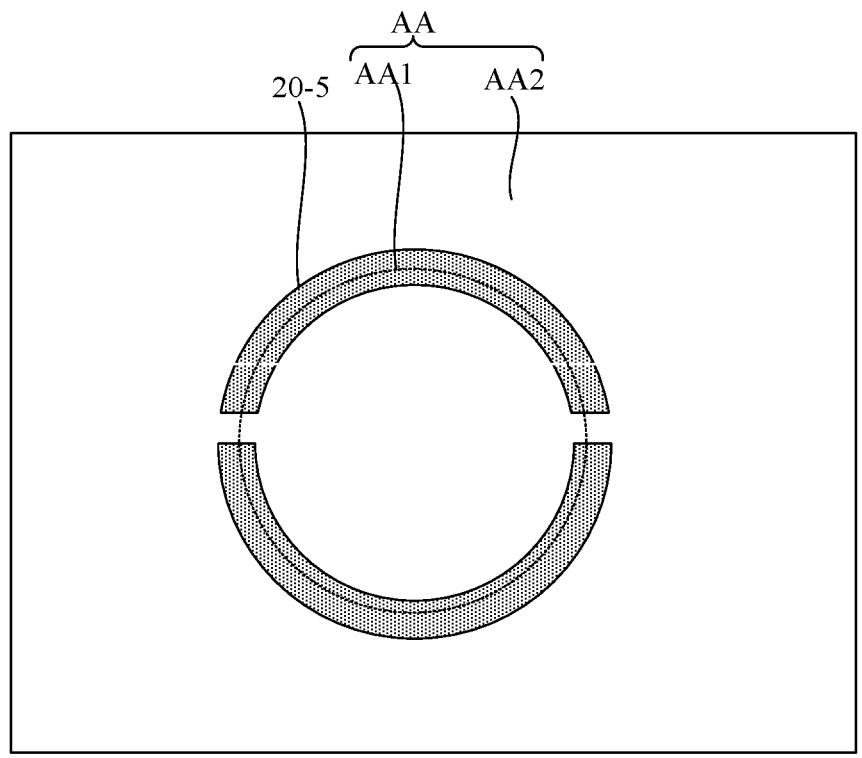
FIG. 29 is a schematic diagram of another display panel according to an embodiment of the present disclosure.

In another embodiment, FIG. 29 is a schematic diagram of another display panel according to an embodiment of the present disclosure. As shown in FIG. 29, two fifth microstructures 20-5 are arranged along the edge of the first display region AA1. In practice, the number of fifth microstructures 20-5 can be set according to specific design requirements. In some embodiments, three or more fifth microstructures 20-5 are arranged along the edge of the first display region AA1.

Figure 30:
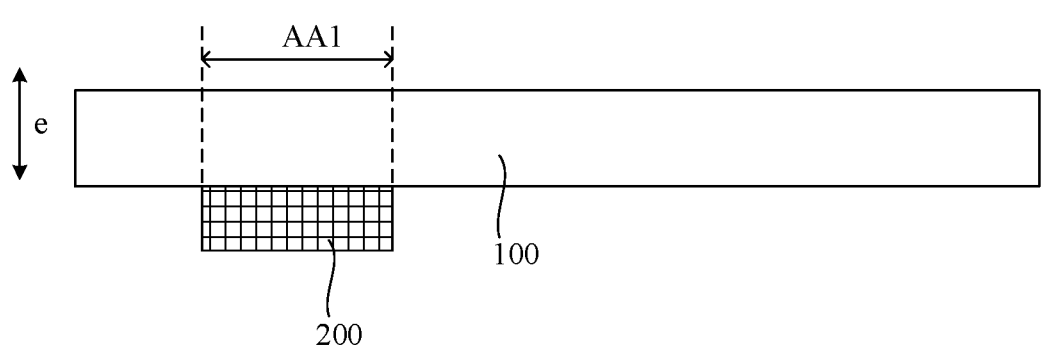
FIG. 30 is a schematic diagram of a display apparatus according to an embodiment of the present disclosure.

Based on the same inventive concept, the embodiments of the present disclosure further provide a display apparatus. FIG. 30 is a schematic diagram of a display apparatus according to an embodiment of the present disclosure. As shown in FIG. 30, the display apparatus includes an optical sensor 200 and the display panel 100 provided in any one of the foregoing embodiments of the present disclosure. In a direction e perpendicular to a plane of a substrate (not marked in FIG. 30), the optical sensor 200 at least partially overlaps with the first display region AA1. The structure of the display panel 100 has been described in the foregoing embodiments, and details are not described herein again. The optical sensor 200 may be, for example, a front-facing camera, an infrared sensing element, a fingerprint recognition sensor, or other photosensitive devices.

The display panel provided by the embodiments of the present disclosure can improve the light transmittance first display region AA1, and can increase the amount of light received by the optical sensor 200 during application, thereby improving the optical performance of the optical sensor 200. In this embodiment of the present disclosure, the display apparatus may be, for example, any of devices, having a display function, such as a mobile phone, a tablet computer, a notebook computer, an electronic paper book, a television, or a smart watch.

Figure 31:
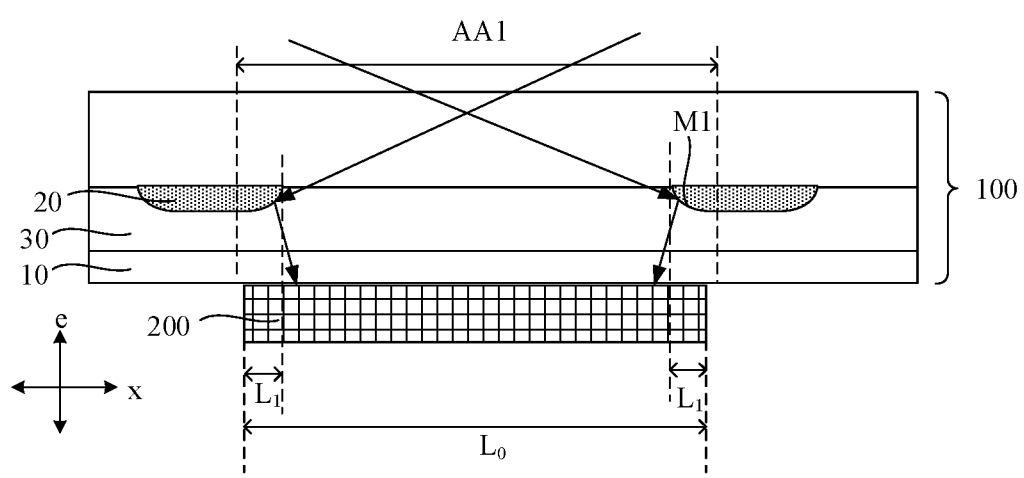
FIG. 31 is a schematic diagram of another display apparatus according to an embodiment of the present disclosure.

In some implementations, FIG. 31 is a schematic diagram of another display apparatus according to an embodiment of the present disclosure. The structure of the display panel 100 is simplified in FIG. 31, and structures such as the pixel circuit layer and the light-emitting device layer in the display panel 100 are not shown. It can be understood that, along a direction e perpendicular to the plane in which the substrate 10 is located, the optical sensor 200 is projected to the plane in which the substrate 10 is located, to obtain an orthographic projection on the plane in which the substrate 10 is located. As shown in FIG. 31, the orthographic projection of the optical sensor 200 on the plane in which the substrate 10 is located is a first projection, and an orthographic projection of the microstructure 20 on the plane in which the substrate 10 is located is a second projection, a length of an overlapping portion between the first projection and the second projection is $L_1$ in a first direction x, the first direction x is parallel to the plane in which the substrate 10 is located, and a length of the first projection is $L_0$ in the first direction, Wherein $L_1 < L_0/2$. In other words, in the direction of the plane in which the substrate 10 is located, the optical sensor 200 and the microstructure 20 at least partially overlap. It can be seen from the cross-sectional view in FIG. 31 that, two terminals of the optical sensor 200 in the first direction x overlap with the microstructures 20 respectively. With such a configuration, after being incident on the first interface M1 for contact between the microstructure 20 and the optical auxiliary structure 30, large-angle light transmitted to the edge of the first display region AA1 will be reflected by the first interface M1 and thus the optical path is changed, so that the reflected light is finally emitted from the back side corresponding to the first display region AA1, thereby contributing to the light emitting of the first display region AA1 and improving the light transmittance of the first display region AA1, which can correspondingly increase the amount of light received by the optical sensor 200 and improve the optical performance of the optical sensor 200.

In the display apparatus provided by some embodiments, at least one microstructure 20 is arranged along the edge of the first display region AA1. In this implementation, for the arrangement of the microstructure 20, reference may be made to the arrangement manner of the fifth microstructure 20-5 in the embodiment shown in FIG. 26 or FIG. 29. The microstructure 20 is arranged along the edge of the first display region AA1, so that large-angle light incident on the edge of the first display region AA1 from different directions can all be used and finally emitted from the back side of the corresponding to the first display region AA1, thereby improving the light transmittance of the first display region AA1. The amount of light received by the optical sensor 200 can be improved correspondingly, thus improving the optical performance of the optical sensor 200.

The above descriptions are representative embodiments of the present disclosure, and are not intended to limit the present disclosure. Any modifications, equivalent replacements, improvements, and the like made within the spirit and principle of the present disclosure shall fall within the protection scope of the present disclosure.

Finally, it should be noted that the foregoing embodiments are intended to describe and not to limit the technical solutions of the present disclosure. Although the present disclosure has been described in detail with reference to the foregoing embodiments, persons skilled in the art should understand that they can still make modifications to the technical solutions described in the foregoing embodiments or make equivalent replacements to some or all of the technical features thereof. These modifications or replacements do not make the essence of the corresponding technical solutions deviate from the scope of the technical solutions of the embodiments of the present disclosure.

What is claimed is:

1. A display panel having a display region comprising a first display region and a second display region, wherein the display panel comprises:
   a substrate; and
   microstructures and optical auxiliary structures located on a first side of the substrate,
   wherein a refractive index of the microstructures is less than a refractive index of the optical auxiliary structures, wherein each of the microstructures is located on and embedded in a side of one of the optical auxiliary structures that is away from the substrate,
   wherein the first display region is provided with at least one of the microstructures, the first display region is provided with a light-emitting device layer, the light-emitting device layer and the at least one of the microstructures are located on the first side of the substrate, the light-emitting device layer comprises a first electrode layer, a light-emitting layer, and a second electrode layer, wherein the second electrode layer is located on a first side of the first electrode layer that is away from the substrate, wherein the microstructures are located on a side of the second electrode layer that is towards the substrate;
   wherein contact interfaces between the microstructures and the optical auxiliary structures comprise a first interface, wherein the first interface intersects a surface parallel to a plane in which the substrate is located, and the first interface is a plane or a curved surface.

2. The display panel according to claim 1, wherein in a direction perpendicular to a plane in which the substrate is located, a thickness of each of the microstructures is d, wherein 20 μm≤d≤50 μm.

3. The display panel according to claim 1, wherein at least one of the microstructures has a first surface on a side away from the substrate, and in the at least one of the microstructures, a maximum angle formed between the first interface and the first surface and facing towards an interior of the at least one of the microstructures is θ1, wherein 0°<θ1≤33°.

4. The display panel according to claim 1, wherein at least one of the microstructures has a first surface on a side away from the substrate, and in the at least one of the microstructures, a maximum angle formed between the first interface and the first surface and facing towards an interior of the at least one of the microstructures is θ2, wherein 123°≤θ2<180°.

5. The display panel according to claim 1, wherein for two adjacent microstructures of the microstructures, the optical auxiliary structures corresponding to the two adjacent microstructures are independent of each other.

6. The display panel according to claim 1, wherein at least two microstructures of the microstructures are embedded in one optical auxiliary structure of the optical auxiliary structures.

7. The display panel according to claim 1, wherein:
the first display region is provided with a metal structure located on the first side of the substrate, the first display region comprises a light-transmittance region, and
in a direction perpendicular to a plane in which the substrate is located, the metal structure does not overlap the light-transmittance region, and the microstructures do not overlap at least part of the light-transmittance region.

8. The display panel according to claim 1, wherein:
the first display region is provided with a metal structure located on the first side of the substrate, and the metal structure comprises a first metal structure, and
the microstructures and at least one of the optical auxiliary structures in contact with the microstructures are located on a same side of the first metal structure that is away from the substrate.

9. The display panel according to claim 8, wherein:
the first electrode layer comprises the first metal structure, and
the microstructures comprise at least one first microstructure, and the at least one first microstructure is located on the first side of the first electrode layer that is away from the substrate.

10. The display panel according to claim 9, wherein:
at least one of the at least one first microstructure is arranged along a circumferential direction of the first metal structure.

11. The display panel according to claim 8, wherein the microstructures are located on a side of the first electrode layer that is toward the substrate.

12. The display panel according to claim 11, wherein:
the first display region is provided with a pixel circuit layer that is located on the first side of the substrate, and the light-emitting device layer is located on a side of the pixel circuit layer that is away from the substrate,
the pixel circuit layer comprises a first metal layer, the first metal layer is located on a side of the light-emitting device layer that is toward the substrate, and is a metal layer closest to the light-emitting device layer, wherein the first metal layer comprises the first metal structure, and
the microstructures comprise a second microstructure, and the second microstructure is located on a side of the first metal layer that is toward the light-emitting device layer.

13. The display panel according to claim 11, wherein:
the first display region is provided with a pixel circuit layer located on the first side of the substrate, the pixel circuit layer comprises a first metal layer, a second metal layer, and a third metal layer; and the second metal layer is located on a side of the first metal layer that is toward the substrate, and the third metal layer is located on a side of the second metal layer that is toward the substrate,
the second metal layer comprises a first electrode, the third metal layer comprises a second electrode, and in a direction perpendicular to a plane in which the substrate is located, the first electrode and the second electrode overlap with each other to form a storage capacitor,
the second metal layer comprises the first metal structure, and
at least some of the microstructures comprise a third microstructure located on a side of the second metal layer toward the first metal layer.

14. The display panel according to claim 11, wherein:
the first display region is provided with a pixel circuit layer located on the first side of the substrate, the pixel circuit layer comprises a first metal layer, a second metal layer, and a third metal layer, the second metal layer is located on a side of the first metal layer that is toward the substrate, the third metal layer is located on a side of the second metal layer that is toward the substrate, the second metal layer comprises a first electrode, the third metal layer comprises a second electrode, and in a direction perpendicular to a plane in which the substrate is located, the first electrode and the second electrode overlap with each other to form a storage capacitor,
the third metal layer comprises the first metal structure, and
at least one of the microstructures comprises a fourth microstructure located on a side of the third metal layer that is toward the second metal layer.

15. The display panel according to claim 1, wherein:
at least one of the microstructures further comprises a fifth microstructure arranged along an edge of the first display region.

16. The display panel according to claim 15, wherein:
the display panel further comprises a buffer layer and a pixel circuit layer located on the first side of the substrate, and the pixel circuit layer is located on a first side of the buffer layer that is toward to the light-emitting device layer, and
the fifth microstructure is located on a second side of the buffer layer that is toward to the substrate.

17. A display apparatus, comprising an optical sensor and a display panel, wherein the display panel has a display region comprising a first display region and a second display region, the display panel comprising:
a substrate; and
microstructures and optical auxiliary structures located on a first side of the substrate,
wherein a refractive index of the microstructures is less than a refractive index of the optical auxiliary structures, and each of the microstructures is located on and embedded in a side of the optical auxiliary structures that is away from the substrate, wherein the first display region is provided with at least one of the microstructures, the first display region is provided with a light-emitting device layer, the light-emitting device layer and the at least one of the microstructures are located on the first side of the substrate, the light-emitting device layer comprises a first electrode layer, a light-emitting layer, and a second electrode layer, and the second electrode layer is located on a side of the first electrode layer that is away from the substrate, wherein contact interfaces between the microstructures and the optical auxiliary structures comprise a first interface, wherein the first interface intersects a surface parallel to a plane in which the substrate is located, and the first interface is a plane or a curved surface; and the microstructures are located on a side of the second electrode layer that is toward the substrate; wherein in a direction perpendicular to a plane in which the substrate is located, the optical sensor overlaps at least part of the first display region.

18. The display apparatus according to claim 17, wherein:
an orthographic projection of the optical sensor on the plane in which the substrate is located is a first projection, an orthographic projection of one of the microstructures on the plane in which the substrate is located is a second projection, an overlapping portion between the first projection and the second projection has a length L in a first direction, and the first direction is parallel to the plane in which the substrate is located, and the first projection has a length $L_0$ in the first direction, wherein $L_1<L_0/2$.

19. The display apparatus according to claim 17, wherein at least one of the microstructures is arranged along an edge of the first display region.

* * * * *